United States Patent
Fukui

(10) Patent No.: US 8,217,096 B2
(45) Date of Patent: Jul. 10, 2012

(54) PHOTOCURABLE PRESSURE-SENSITIVE ADHESIVE COMPOSITION

(75) Inventor: Hiroji Fukui, Osaka (JP)

(73) Assignee: Sekisui Chemical Co., Ltd., Osaka (JP)

( * ) Notice: Subject to any disclaimer, the term of this patent is extended or adjusted under 35 U.S.C. 154(b) by 179 days.

(21) Appl. No.: 12/663,151

(22) PCT Filed: Jun. 4, 2008

(86) PCT No.: PCT/JP2008/060273
§ 371 (c)(1),
(2), (4) Date: Dec. 4, 2009

(87) PCT Pub. No.: WO2008/152956
PCT Pub. Date: Dec. 18, 2008

(65) Prior Publication Data
US 2010/0184880 A1 Jul. 22, 2010

(30) Foreign Application Priority Data

Jun. 14, 2007 (JP) ................. 2007-157826
May 13, 2008 (JP) ................. 2008-126162

(51) Int. Cl.
*C09J 133/00* (2006.01)
*C09J 163/00* (2006.01)
(52) U.S. Cl. ............... 522/63; 522/65; 522/26; 522/28; 522/126; 522/129; 525/107; 525/123
(58) Field of Classification Search .......... 522/26, 522/28, 63, 65, 126, 129; 525/107, 123
See application file for complete search history.

(56) References Cited

U.S. PATENT DOCUMENTS

| | | | | |
|---|---|---|---|---|
| 4,021,391 A * | 5/1977 | Ijichi et al. | ............ | 524/764 |
| 4,665,127 A * | 5/1987 | Hirose et al. | ............ | 525/100 |
| 5,574,084 A * | 11/1996 | Peacock | ............ | 524/270 |
| 6,057,380 A * | 5/2000 | Birbaum et al. | ............ | 522/8 |
| 6,376,070 B1 | 4/2002 | Nakasuga et al. | | |
| 7,538,104 B2 * | 5/2009 | Baudin et al. | ............ | 514/214.02 |
| 7,714,162 B2 * | 5/2010 | Aoki et al. | ............ | 560/163 |
| 2003/0026979 A1 | 2/2003 | Nakasuga et al. | | |
| 2006/0052475 A1 | 3/2006 | Husemann et al. | | |
| 2009/0298962 A1 * | 12/2009 | Studer et al. | ............ | 522/46 |

FOREIGN PATENT DOCUMENTS

| | | |
|---|---|---|
| CN | 1170747 A | 1/1998 |
| JP | 2000-144094 A | 5/2000 |
| JP | 2003-176332 A | 6/2003 |
| JP | 2005-76005 A | 3/2005 |
| JP | 2005-536620 A | 12/2005 |
| JP | 2006-282657 A | 10/2006 |

OTHER PUBLICATIONS

International Search Report for the Application No. PCT/JP2008/060273 mailed Oct. 7, 2008.

* cited by examiner

*Primary Examiner* — Susan W Berman
(74) *Attorney, Agent, or Firm* — Cheng Law Group, PLLC

(57) ABSTRACT

The present invention provides a photocurable pressure-sensitive adhesive composition which has sufficient adhesion before being irradiated with light, and after being irradiated with light, keeps a sufficient pot life and has a short cure-completion time at a room temperature. A cured product produced from the composition has high adhesion force to adherends difficult to be attached, and excellent durability. The photocurable pressure-sensitive adhesive composition comprises a crosslinking compound (A) that is crosslinkable by the action of a base, a photobase generator (B) which becomes active upon light irradiation to generate a base, and a tackifying component (C).

8 Claims, No Drawings

PHOTOCURABLE PRESSURE-SENSITIVE ADHESIVE COMPOSITION

TECHNICAL FIELD

The present invention relates to a photocurable pressure-sensitive adhesive composition usable as, for example, products such as adhesives and sealants. More specifically, the present invention relates to a photocurable pressure-sensitive adhesive composition which has sufficient adhesion before being irradiated with light, and exhibits bonding power with excellent durability after being cured by irradiation with light.

BACKGROUND ART

Up until now, various photo cationically polymerizable compositions have been designed which cationically polymerize and cure upon irradiation with light. Photo cationically polymerizable compositions of this kind contain a photo cationic polymerization initiator activated by irradiation with light and a cationically polymerizable compound in which cationic polymerization is induced by the activated photo cationic polymerization initiator.

An onium salt and an iron arene complex, for example, are used as the above-mentioned photo cationic polymerization initiator. Further, an epoxy compound, a vinyl ether compound, a compound having an oxetane group, or a compound having an alkoxysilyl group is used as the above-mentioned cationically polymerizable compound.

The photo cationically polymerizable compositions are considered to be used for a paint, a coating agent, a varnish, a matrix of a composite, a stereolithography material, an adhesive, a pressure-sensitive adhesive, or the like. Use of an epoxy compound as the photo cationically polymerizable composition particularly makes it possible to increase the adhesion force, creep resistance, weather resistance, water resistance, heat resistance, chemical resistance, and the like of a cured product produced from the composition.

A photo cationically polymerizable composition to be used for the above-mentioned various products is desired to have a high cure rate, as well as high adhesion force to an adherend, high weather resistance and the like of a cured product. Further, a photo cationically polymerizable composition to be used for an adhesive is desired to have a long enough pot life during which bonding operation can be performed, and also fast-curing characteristics upon the bonding operation. That is, the adhesive needs to retain, for a certain period of time after irradiation with light, the fluidity, wettability, and adhesion of a degree at which the bonding operation can be performed.

The below mentioned Patent Document 1 discloses as an example of the above photo cationically polymerizable composition a photocurable pressure-sensitive adhesive composition that contains a cationically polymerizable compound having a cationically polymerizable group, a photo cationic polymerization initiator, and a polymer. Here, a (meth)acrylic polymer, a polyester or the like is used as the polymer.
Patent Document 1: JP 2000-144094 A

DISCLOSURE OF THE INVENTION

The photocurable pressure-sensitive adhesive composition of Patent Document 1 has adhesion before being irradiated with light. Further, the composition retains the adhesion for a while after being irradiated with light. While the adhesion is retained, that is, during a pot life, a bonding operation can be performed. Also, the photocurable pressure-sensitive adhesive composition exhibits high adhesive strength after completion of curing.

Although the adhesion of the photocurable pressure-sensitive adhesive composition before irradiation with light is increased by a certain degree, it has been strongly desired to further increase the adhesion.

One way of increasing the adhesion before irradiation with light is to add a tackifying component. However, the tackifying component could not be used in the photocurable pressure-sensitive adhesive composition of Patent Document 1. This is because a polar functional group of the tackifying component contributing to an increase in the adhesion strongly interacts with a cation of the cationically polymerizable compound, resulting makes it impossible to keep a sufficient pot life after irradiation with light. Further, even when the tackifying component is to be used, the compounding amount thereof needs to be very small.

Furthermore, the photocurable pressure-sensitive adhesive composition of Patent Document 1 sometimes provides low durability to a cured product produced upon completion of curing. In addition, the adhesion force to some types of adherends is insufficient.

In view of the current conditions of the conventional art, an object of the present invention is to provide a photocurable pressure-sensitive adhesive composition which has sufficient adhesion before being irradiated with light, and after being irradiated with light, keeps a sufficient pot life and has a short cure-completion time at a room temperature. Another object of the present invention is to provide a cured product produced from the photocurable pressure-sensitive adhesive composition which has high adhesion force to adherends difficult to be attached, and excellent durability.

The present invention provides a photocurable pressure-sensitive adhesive composition, which comprises a crosslinking compound (A) that is crosslinkable by the action of a base, a photobase generator (B) that generates a base by irradiation with light, and a tackifying component (C).

In the present invention, the tackifying component (C) preferably has a polar functional group. A tackifying component having a polar functional group may contribute to a further increase in the adhesion of the photocurable pressure-sensitive adhesive composition before irradiation with light.

In a particular aspect of the present invention, the photocurable pressure-sensitive adhesive composition may further comprise a base proliferating agent (D). In this case, it may be possible to efficiently generate a base by irradiation with light. Therefore, the time to completion of curing can be further shortened. The base proliferating agent (D) is preferably a base proliferating agent (D1) that has a base proliferating group represented by the following formula (1). In this case, it may be possible to more generate a base efficiently by irradiation with light.

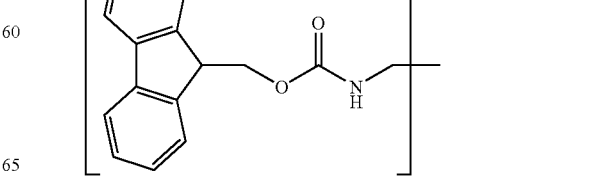

The photocurable pressure-sensitive adhesive composition preferably further comprises a photo-sensitizer (E). This may make it possible to increase the sensitivity of the photocurable pressure-sensitive adhesive composition to the light, thereby decreasing the light radiation energy in exposure.

In another particular aspect of the present invention, the crosslinking compound (A) may have, in one molecule thereof, two or more crosslinkable functional groups, the crosslinkable functional group being at least one functional group selected from the group consisting of (meth)acryloyl group, isocyanato group, epoxy group, acid anhydride group, and hydrolyzable silyl group. In this case, it may be possible to further shorten the time to completion of curing of the photocurable pressure-sensitive adhesive composition, and further increase the adhesion force after the photocurable pressure-sensitive adhesive composition was cured.

In still another particular aspect of the present invention, the photobase generator (B) may be an ortho-nitrobenzyl type photobase generator or a ketoprofen type photobase generator. In this case, it may be possible to increase the sensitivity of the photocurable pressure-sensitive adhesive composition to the light.

In still another particular aspect of the present invention, the tackifying component (C) may be at least one polymer selected from the group consisting of (meth)acrylic polymer, polyester, polyurethane, polyolefin, and silicone polymer. In this case, it may be possible to easily control the adhesion of the photocurable pressure-sensitive adhesive composition.

EFFECT OF THE INVENTION

The photocurable pressure-sensitive adhesive composition according to the present invention comprises a crosslinking compound (A), a photobase generator (B), and a tackifying component (C), and thus the adhesion thereof before irradiation with light can be sufficiently increased. Further, it is possible to make a pot life after irradiation with light sufficiently long, and make the time to completion of curing comparatively short.

Therefore, the photocurable pressure-sensitive adhesive composition makes it possible to increase the workability in bonding and shorten the operation time. Accordingly, the photocurable pressure-sensitive adhesive composition according to the present invention can be suitably used, for example, as a pressure-sensitive adhesive, a caulking, a varnish, or the like.

Further, the photocurable pressure-sensitive adhesive composition according to the present invention exhibits high adhesion force after being cured by irradiation with light. Also, the photocurable pressure-sensitive adhesive composition can provide a cured product with excellent durability. The cured product produced from the photocurable pressure-sensitive adhesive composition according to the present invention has excellent adhesion force to adherends difficult to be attached, such as aluminum plates or copper plates.

BEST MODE FOR CARRYING OUT THE INVENTION

Hereinafter, the present invention will be described in detail.

The photocurable pressure-sensitive adhesive composition according to the present invention comprises a crosslinking compound (A) that is crosslinkable by the action of a base, a photobase generator (B) that generates a base by irradiation with light, and a tackifying component (C).

(Crosslinking Compound (A))

The crosslinking compound (A) that is crosslinkable by the action of a base is not particularly limited so long as the compound has a crosslinkable functional group.

The crosslinkable functional group is not particularly limited. Specific examples of the crosslinkable functional group include (meth)acryl group, isocyanato group, epoxy group, acid anhydride group, hydrolyzable silyl group, halomethyl group, and carbonyl group. A preferable crosslinkable functional group among these is any one of (meth)acryloyl group, isocyanato group, epoxy group, acid anhydride group, and hydrolyzable silyl group.

The crosslinking compound (A) preferably has, in one molecule thereof, two or more crosslinkable functional groups, the crosslinkable functional group being at least one functional group selected from the group consisting of (meth)acryloyl group, isocyanato group, epoxy group, acid anhydride group, and hydrolyzable silyl group. This makes it possible to increase the curability of the photocurable pressure-sensitive adhesive composition after irradiation with light. Further, the cohesion of the cured product can be increased, which results in an increase in the adhesion force of the cured product.

Specific examples of the crosslinking compound (A) include epoxy compounds, (meth)acrylate oligomers, isocyanate oligomers, compounds such as alkoxysilane which have a hydrolyzable silyl group, and compounds such as tetracarboxylic anhydride which have an acid anhydride group.

Preferable among these is an epoxy compound or isocyanate oligomer because the action of a base causes a crosslinking reaction to efficiently proceed.

The crosslinking compound (A) may be used alone or in combination of two or more kinds thereof. The crosslinking compound (A) may have one kind of crosslinkable functional group, or may have two or more kinds of crosslinkable functional groups.

The above epoxy compound is not particularly limited. Specific examples of the epoxy compound include bisphenol F-type epoxy resins, bisphenol A-type epoxy resins, novolac epoxy resins such as novolac-type epoxy oligomers, brominated epoxy resins, and flexible epoxy resins which are listed in a brochure provided by Tohto Kasei Co., Ltd.; EPIKOTE solid epoxy resins and EPIKOTE bis-F solid epoxy resins which are listed in a brochure provided by Yuka-Shell Epoxy Co., Ltd.; and EHPE alicyclic solid epoxy resins, homopolymers of glycidyl methacrylate, and copolymers of glycidyl methacrylate which are listed in a brochure provided by Daicel Chemical Industries, Ltd.

Examples of the epoxy compound further include EX-611, EX-612, EX-614, EX-614B, EX-622, EX-512, EX-521, EX-411, EX-421, EX-313, EX-314, EX-321, EX-201, EX-211, EX-212, EX-252, EX-810, EX-811, EX-850, EX-851, EX-821, EX-830, EX-832, EX-841, EX-861, EX-911, EX-941, EX-920, EX-721, EX-221, EM-150, EM-101, and EM-103 which are listed as Denacol series in a brochure provided by Nagase ChemteX Corporation; YD-115, YD-115G, YD-115CA, YD-118T, and YD-127 which are listed in the brochure provided by Tohto Kasei Co., Ltd.; and liquid epoxy resins such as 40E, 100E, 200E, 400E, 70P, 200P, 400P, 1500NP, 1600, 80MF, 100MF, 4000, 3002, and 1500 which are listed as EPOLIGHT series in a brochure provided by Kyoeisha Chemical Co., Ltd.

Examples of the epoxy compound further include liquid epoxy resins such as Celloxide 2021, Celloxide 2080, Celloxide 3000, Epolead GT300, Epolead GT400, Epolead D-100ET, Epolead D-100OT, Epolead D-100DT, Epolead D-100ST, Epolead D-200HD, Epolead D-200E, Epolead D-204P, Epolead D-210P, Epolead PB3600, and Epolead PB4700 which are alicyclic epoxy compounds, listed in a brochure provided by Daicel Chemical Industries, Ltd.

Examples of the (meth)acrylate oligomer include neopentyl glycol-modified trimethylol propane di(meth)acrylate, ethylene oxide-modified trimethylolpropane tri(meth)acrylate, propylene oxide-modified trimethylolpropane tri(meth)acrylate, hydroxypropyl acrylate-modified trimethylolpropane trimethacrylate, pentaerythritol triacrylate, pentaerythritol tetra(meth)acrylate, stearic acid-modified pentaerythritol di(meth)acrylate, dipentaerythritol hexa(meth)acrylate, dipentaerythritol monohydroxy penta(meth)acrylate, alkyl-modified dipentaerythritol poly(meth)acrylate, caprolactone-modified dipentaerythritol poly(meth)acrylate, glycerin di(meth)acrylate, epichlorohydrin-modified glycerol tri(meth)acrylate, oxide-modified glycerol tri(meth)acrylate, tris(acryloxyethyl) isocyanurate, tris(methacryloxyethyl) isocyanurate, caprolactone-modified tris(acryloxyethyl) isocyanurate, caprolactone-modified tris(methacryloxyethyl) isocyanurate, and oxide-modified bisphenol(meth)acrylate.

Examples of the (meth)acrylate oligomer further include polyester dendrimers that have an ethylenically unsaturated group. A specific example of a polyester dendrimer that has an ethylenically unsaturated group is described for example in JP 2005-76005 A.

Examples of the isocyanate oligomer include tolylene diisocyanate, metaxylene diisocyanate, hexamethylene diisocyanate, isophorone diisocyanate, and compounds that are obtainable via reaction of diisocyanate with polyol and that have two or more known isocyanato groups.

Examples of the compound that has a hydrolyzable silyl group include alkoxysilane, bis(methyldimethoxysilyl) polypropylene glycol, bis(methyldimethoxysilyl) polyisobutylene, and (meth)acrylate having an alkoxysilyl group. Examples of the alkoxysilane include tetramethoxysilane, tetraethoxysilane, tetraisopropoxysilane, trimethoxysilane, methyltrimethoxysilane, triethoxysilane and ethyltriethoxysilane.

Examples of the compound that has an acid anhydride group include bicyclo[2,2,2]oct-7-ene-2,3,5,6-tetracarboxylic dianhydride, ethylenediamine tetraacetic acid dianhydride, diethylenetriamine pentaacetic acid dianhydride, 3,3',4,4'-benzophenone tetracarboxylic dianhydride, 4,4'-(hexafluoroisopropylidene)diphthalic anhydride, 1,2,4,5-benzene tetracarboxylic dianhydride, 1,4,5,8-naphthalene tetracarboxylic dianhydride, 3,4,9,10-perylene tetracarboxylic dianhydride, tetracarboxylic acids such as pyromellitic acid anhydride, and copolymers of maleic anhydride and a compound that has a polymerizable unsaturated group such as (meth)acrylic ester.

(Photobase Generator (B))

A photobase generator (B) comprised in the photocurable pressure-sensitive adhesive composition according to the present invention becomes active upon irradiation with light to generate a base.

The photobase generator (B) is not particularly limited so long as it generates a base upon being irradiated with light. Specific examples of the photobase generator (B) include ortho-nitrobenzyl type photobase generators, (3,5-dimethoxybenzyloxy)carbonyl type photobase generators, amyloxyimino group type photobase generators, dihydropyridine type photobase generators, ketoprofen type photobase generators, and coumaric acid amide type photobase generators. Among these, ortho-nitrobenzyl type photobase generators, ketoprofen type photobase generators, and coumaric acid amide type photobase generators are preferable, and ortho-nitrobenzyl type photobase generators and ketoprofen type photobase generators are more preferable. Use of these preferable photobase generators makes it possible to increase the base generation efficiency. Therefore, the sensitivity of the photocurable pressure-sensitive adhesive composition to the light can be increased. Further, these photobase generators can be easily synthesized.

Examples of the ketoprofen type photobase generators include 1,3-di-4-piperidylpropane di(α-(2-benzoyl)phenylpropionate), 1,6-hexamethylenediamine di(α-(2-benzoyl)phenylpropionate), and 9-DBU(2-benzoyl)phenylpropionate.

The photobase generator (B) is preferably a photobase generator (PBG-2) represented by the following formula, which is an ortho-nitrobenzyl type photobase generator, or a keptofen amine salt type photobase generator, which is a keptofen type photobase generator. These photobase generators can further increase the base generation efficiency. The photobase generator (PBG-2) represented by the following formula can be produced in accordance with the method described in JP 2006-282657 A.

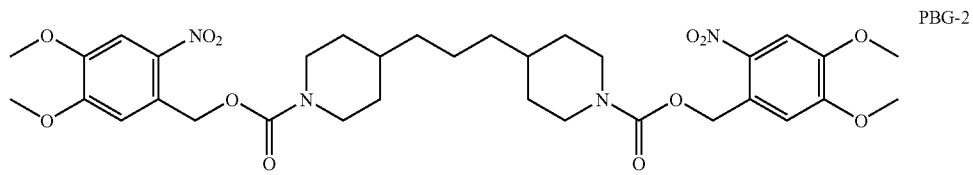

PBG-2

The compounding ratio of the photobase generator (B) per 100 parts by weight of crosslinking compound (A) is preferably in the range of 10 to 200 parts by weight. A too small amount of the photobase generator (B) may lead to a low rate of base generation, which may decrease the curability of the crosslinking compound (A). On the other hand, a too large amount of the photobase generator (B) may lead to insufficient curability or a precipitation of the photobase generator (B).

(Tackifying Component (C))

The photocurable pressure-sensitive adhesive composition according to the present invention comprises a tackifying component (C) that provides adhesion.

The tackifying component (C) is not particularly limited so long as it is a component that provides adhesion. The tackifying component (C) is preferably a resin that exhibits adhesion, or a basic additive.

The resin that exhibits adhesion is preferably a polymer. The polymer is preferably a (meth)acrylic polymer, a polyester, a polyurethane, a silicone, a polyether, a polycarbonate, a polyvinyl ether, a polyvinyl chloride, a polyvinyl acetate, a polyisobutylene, a polyolefin, a silicone polymer, or a copolymer based on these polymers. Among these, at least one polymer selected from the group consisting of (meth)acrylic polymer, polyester, polyurethane, polyolefin, and silicone polymer is more preferable. These resins that exhibit adhesion make it possible to easily control the adhesion of the photobase pressure-sensitive adhesive composition.

If a polymer is to be used as the resin that exhibits adhesion, the polymer structure is not particularly limited. Specific examples of the polymer structure include random copolymer structures, block copolymer structures, alternating copolymer structures, stereoregular copolymer structures, hyperbranched copolymer structures, star copolymer structures, dendritic copolymer structures, ladder copolymer structures, circular copolymer structures, and helix copolymer structures.

The number-average molecular weight (molecular weight converted as the molecular weight of polystyrene, which is determined by gel permeation chromatography) of the above polymer is preferably 50,000 to 5,000,000. A number-average molecular weight of smaller than 50,000 may lead to insufficient cohesion; generation of stringiness at the time of attachment; or detachment. On the other hand, a number-average molecular weight of larger than 5,000,000 may lead to too high viscosity, and make application and sheet molding difficult. The number-average molecular weight of the above polymer is preferably 100,000 to 1,000,000, and more preferably 200,000 to 500,000.

The above (meth)acrylic polymer can be obtained by polymerizing (meth)acrylic acids or (meth)acrylic acid esters. Examples of a polymerization reaction thereof include free radical polymerization reactions, living radical polymerization reactions, and living anionic polymerization reactions. These polymerization reactions can be initiated when energy such as heat, ultraviolet ray, or electron ray is supplied. Further, examples of a method of the polymerization include bulk polymerization, solution polymerization, soap-free polymerization, suspension polymerization, and emulsion polymerization. A reaction initiator may be used in the polymerization.

Examples of the (meth)acrylic acid esters include compounds that have, in one molecule thereof, one (meth)acryloyl group, such as methyl(meth)acrylate, ethyl(meth)acrylate, propyl(meth)acrylate, n-butyl(meth)acrylate, tert-butyl(meth)acrylate, cyclohexyl(meth)acrylate, 2-ethylhexyl(meth)acrylate, n-octyl(meth)acrylate, isooctyl(meth)acrylate, isononyl(meth)acrylate, isomyristyl(meth)acrylate, stearyl(meth)acrylate, isobornyl(meth)acrylate, benzyl(meth)acrylate, 2-butoxyethyl(meth)acrylate, 2-phenoxyethyl(meth)acrylate, glycidyl(meth)acrylate, and tetrahydrofurfuryl(meth)acrylate. Each of these (meth)acrylate acid esters may be used alone or two or more kinds thereof may be used in combination.

The above polymer is preferably a polymer that is produced from a compound (C1) having, in one molecule thereof, at least one (meth)acryloyl group and at least one polar functional group; and a compound (C2) having an unsaturated bond that reacts with the compound (C1) to cause copolymerization. Such a polymer can contribute to an increase in the adhesion force of the cured product to various adherends. Examples of the polar functional group include hydroxyl group, carboxyl group, ether group, thioether group, sulfonyl group, phosphonyl group, amino group, amide group, imide group, and nitrile group. Here, the compound (C1) having a plurality of these polar functional groups may be used.

The above compound (C1) is not particularly limited. Specific examples of the above compound (C1) include 2-hydroxyethyl(meth)acrylate, 3-hydroxypropyl(meth)acrylate, 2-hydroxypropyl(meth)acrylate, 4-hydroxybutyl(meth)acrylate, 2-hydroxybutyl(meth)acrylate, 5-hydroxypentyl(meth)acrylate, 6-hydroxyhexyl(meth)acrylate, 3-hydroxy-3-methylbutyl(meth)acrylate, 2-hydroxy-3-phenoxypropyl(meth)acrylate, pentaerythritol tri(meth)acrylate, 2-[(meth)acryloyloxy]ethyl-2-hydroxyethylphtalic acid, and 2-[(meth)acryloyloxy]ethyl-2-hydroxypropylphtalic acid.

Further, the following compounds 1 to 10 may be used as the above compound (C1).

| | |
|---|---|
| $CH_2=CH-C(O)O-CH_2CH_2O-[C(O)CH_2CH_2CH_2CH_2CH_2O]n\text{-}H$ ($n=1\sim10$) | Compound 1 |
| $CH_2=C(CH_3)-C(O)O-CH_2CH_2O-[C(O)CH_2CH_2CH_2CH_2CH_2O]n\text{-}H$ ($n=1\sim10$) | Compound 2 |
| $CH_2=CH-C(O)O-(CH_2CH_2O)n\text{-}H$ ($n=1\sim12$) | Compound 3 |
| $CH_2=C(CH_3)-C(O)O-(CH_2CH_2O)n\text{-}H$ ($n=1\sim12$) | Compound 4 |
| $CH_2=CH-C(O)O-[CH_2CH(CH_3)O]n\text{-}H$ ($n=1\sim12$) | Compound 5 |
| $CH_2=C(CH_3)-C(O)O-[CH_2CH(CH_3)O]n\text{-}H$ ($n=1\sim12$) | Compound 6 |
| $CH_2=C(CH_3)-C(O)O-(CH_2CH_2O)n\text{-}(CH_2CH(CH_3)O)m\text{-}H$ ($n=1\sim12, m=1\sim10$) | Compound 7 |
| $CH_2=CH-C(O)O-(CH_2CH_2O)n-\partial CH_2CH(CH_3)O)m\text{-}H$ ($n=1\sim12, m=1\sim10$) | Compound 8 |
| $CH_2=C(CH_3)-C(O)O-(CH_2CH_2O)n\text{-}(CH_2CH_2CH_2CH_2O)mH$ ($n=1\sim12, m=1\sim10$) | Compound 9 |
| $CH_2=CH-C(O)O-(CH_2CH_2O)n\text{-}(CH_2CH_2CH_2CH_2O)mH$ ($n=1\sim12, m=1\sim10$) | |

Examples of the above compound (C1) include (meth)acrylonitrile derivatives, N-vinyl derivatives, (meth)acrylic acids, maleic anhydrides, and maleimide acid derivatives.

Examples of the N-vinyl derivative include N-vinyl pyrrolidone, N-acryloyl morpholine, N-vinyl caprolactone, and N-vinyl piperidine. Examples of the N-vinyl derivative further include epoxy acrylate, polyester acrylate, and urethane acrylate.

Each of the compounds (C1) may be used alone or two or more kinds thereof may be used in combination.

The above compound (C2) is not particularly limited so long as it has an unsaturated bond that reacts with the compound (C1) to cause copolymerization. Specific examples of the above compound (C2) include styrene, styrene derivatives, vinyl ester derivatives, and (meth)acrylate derivatives other than the compound (C1). Each of the compounds (C2) may be used alone or two or more kinds thereof may be used in combination.

Examples of the styrene derivatives include indene, p-methyl styrene, α-methyl styrene, p-methoxy styrene, p-tert-butoxy styrene, p-chloromethyl styrene, p-acetoxystyrene, and divinylbenzene.

Examples of the above vinyl ester derivative include vinyl acetate, vinyl propionate, vinyl butyrate, vinyl caproate, and vinyl cinnamate.

Examples of the (meth)acrylate derivatives other than the above compound (C1) include methyl(meth)acrylate, ethyl(meth)acrylate, propyl(meth)acrylate, n-butyl(meth)acrylate, tert-butyl(meth)acrylate, cyclohexyl(meth)acrylate, 2-ethylhexyl(meth)acrylate, n-octyl(meth)acrylate, isooctyl(meth)acrylate, isononyl(meth)acrylate, isomyristyl(meth)acrylate, stearyl(meth)acrylate, isobornyl(meth)acrylate, benzyl(meth)acrylate, 2-butoxyethyl(meth)acrylate, 2-phenoxyethyl(meth)acrylate, glycidyl(meth)acrylate, tetrahydrofurfuryl(meth)acrylate, hexanediol di(meth)acrylate, ethylene glycol di(meth)acrylate, polyethylene glycol di(meth)acrylate, propylene glycol di(meth)acrylate, polypropylene glycol di(meth)acrylate, neopentyl glycol di(meth)acrylate, trimethylolpropane tri(meth)acrylate, pentaerythritol di(meth)acrylate, pentaerythritol tri(meth)acrylate, pentaerythritol tetra(meth)acrylate, and dipentaerythritol hexa(meth)acrylate.

When the compound (C1) and the compound (C2) are to be used, the compound (C2) is preferably used in an amount in the range of 1 to 10,000 parts by weight per 100 parts by weight of the compound (C1). An amount of the compound (C2) of smaller than 1 part by weight may increase the cure rate of the photocurable pressure-sensitive adhesive composition after irradiation with light, thereby making the pot life too short. An amount of the compound (C2) of larger than 10,000 parts by weight may excessively decrease the cure rate of the photocurable pressure-sensitive adhesive composition after irradiation with light.

The basic additive to be used as the tackifying component (C) is not particularly limited. Specific examples of the basic additive include aminosilane and ureidosilane.

The tackifying component (C) preferably has a polar functional group. Use of a tackifying component (C) having a polar functional group can further increase the adhesion of the photocurable pressure-sensitive adhesive composition before irradiation with light. Also, it is possible to further increase the adhesion force of the cured product after crosslinking.

A tackifying component having a basic polar functional group such as an amide group or an amino group is preferably used as the above tackifying component having a polar functional group.

A rosin resin, a modified rosin resin, a terpene resin, a terpene phenol resin, an aromatic modified terpene phenol resin, a C5 or C9 petroleum resin, or a coumarone resin may be used as the tackifying component (C). A rosin resin or a petroleum resin is preferable particularly when the adherend is a polyolefin because the resin can increase the adhesion force of a cured product to the polyolefin.

A compounding ratio of the tackifying component (C) is preferably in the range of 20 to 400 parts by weight per 100 parts by weight of the crosslinking compound (A). A too small amount of the tackifying component (C) may decrease the adhesion of the photocurable pressure-sensitive adhesive composition before irradiation with light. A too large amount of the tackifying component (C) may make the curability attributed to the crosslinking composition (A) insufficient, thereby resulting in insufficient adhesion force after curing.

(Base Proliferating Agent (D))

The photocurable pressure-sensitive adhesive composition of the present invention preferably further comprises a base proliferating agent (D) that generates a base in a proliferating way upon the action of a base.

Examples of the base proliferating agent (D) include 9-fluorenylcarbamate derivatives of a bifunctional type, a spherical polyfunctional oligomer type, a linear chain polymer type, or a siloxane type.

A base proliferating agent (D1) that has a base proliferating group represented by the following formula (1) is preferable as the base proliferating agent (D). The base proliferating group represented by the following formula (1) can be easily obtained by an addition reaction between 9-fluorene methanol and an isocyanato group.

Base Proliferating Agent (D1)

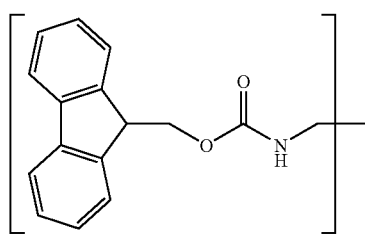

(1)

A base proliferating agent (D1) having the base proliferating group represented by the above formula (1) is degraded by a base multiplication reaction to newly generate an amine.

The generated amine then functions as a new catalyst to generate a large number of new amines in a proliferating way. That means that the larger the number of the base proliferating groups represented by the above formula (1) in a molecule, the better the efficiency of the base multiplication reaction in the molecule. Therefore, the generation efficiency of the amino group can be increased.

In a base multiplication reaction in which the base proliferating agent (D1) having the base proliferating group represented by the above formula (1) is used, an active hydrogen is abstracted by a base to form carbanion. Next, a carbamic acid is eliminated and the degradation proceeds to generate an amino group and carbon dioxide. The amino group serves as a catalyst to accelerate the reaction. The reaction is represented by the following reaction equation (X1).

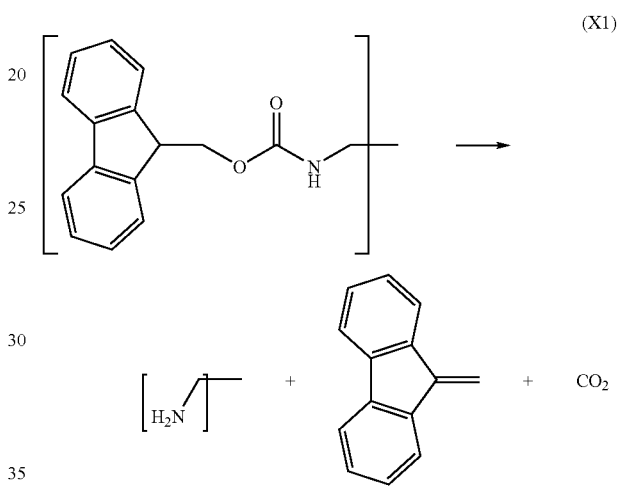

(X1)

The base proliferating group represented by the above formula (1) is preferably a base proliferating group represented by the following formula (2).

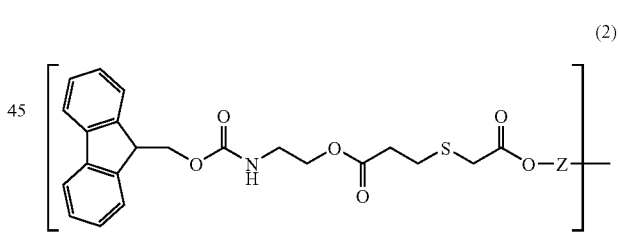

(2)

In the above formula (2), Z represents a substituted or unsubstituted alkylene group.

Specific examples of Z in the above formula (2) include methylene group, ethylene group, and propylene group. Here, Z is preferably an unsubstituted alkylene group because it leads to an effective base multiplication reaction. Among these groups, a methylene group is more preferable as Z because steric hindrance caused by Z tends to be small and the base proliferating reaction tends to occur more effectively.

The base proliferating agent having the base proliferating group represented by the above formula (2) is preferably a base proliferating agent represented by the following formula (3).

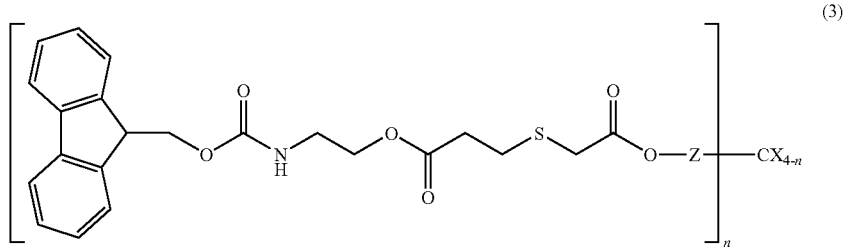

(3)

In the above formula (3), X represents hydrogen, a substituted alkyl group, or an unsubstituted alkyl group. Also, Z represents a substituted or unsubstituted alkylene group, and "n" represents an integer from 1 to 4.

Specific examples of X in the formula (3) include methyl group, ethyl group, or propyl group. X is preferably an unsubstituted alkyl group. This leads to an efficient base proliferating reaction. Further, X is more preferably an ethyl group. This may make the steric hindrance due to X small, thereby leading to a more effective base multiplication reaction.

In the above formula (3), "n" represents an integer from 1 to 4. When the base proliferating agent represented by the above formula (3) has a plurality of 9-fluorenylcarbamate groups in one molecule, the base multiplication reaction tends to occur even more effectively due to the catalytic activity of the generated base. Therefore, "n" in the above formula (3) is preferably 3 or 4.

Specific examples of the base proliferating agent represented by the above formula (3) include base proliferating agents (Flu3) represented by the following formula (4) and base proliferating agents (Flu4) represented by the following formula (5). The base proliferating agents represented by the following respective formulae (4) and (5) can be obtained in accordance with the method described in JP 2006-282657 A.

(4)

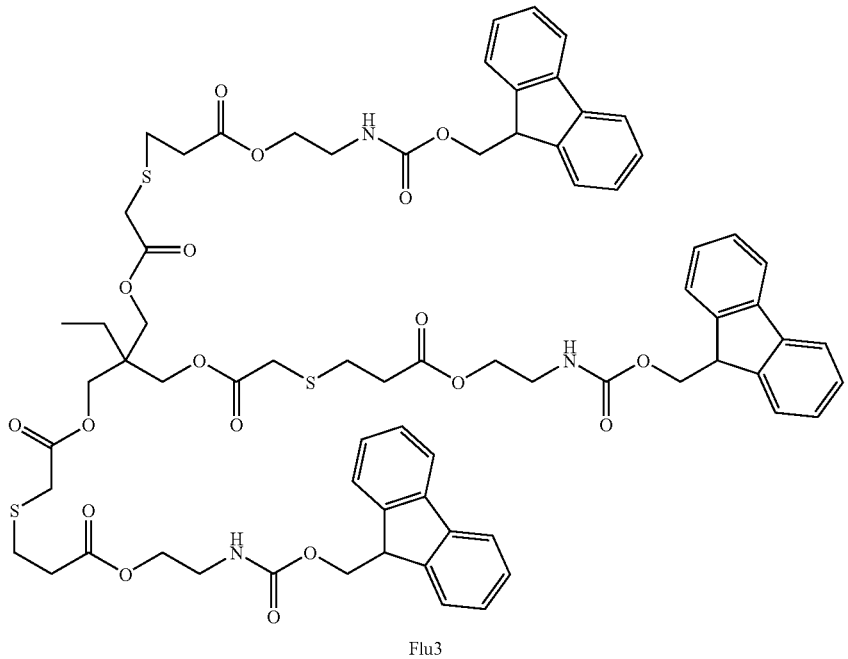

Flu3

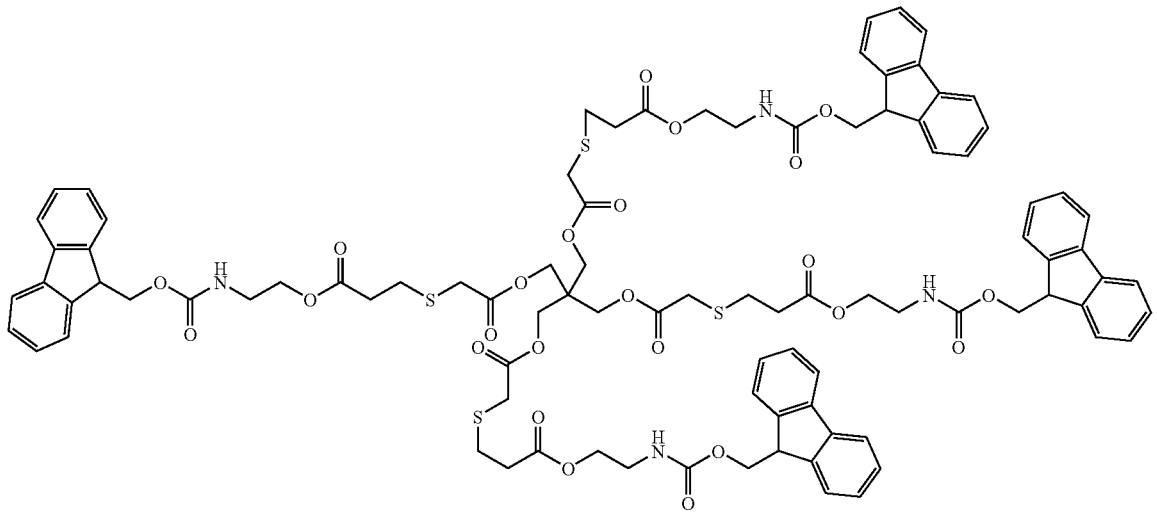

Flu4

The base proliferating agents represented by the respective formulae (4) and (5) each has a plurality of 9-fluorenylcarbamate groups in one molecule. Accordingly, the base multiplication reaction tends to proceed efficiently due to the catalytic activity of the generated base. The base proliferating agent (D) is more preferably a base proliferating agent represented by the above formula (4), and still more preferably a base proliferating agent represented by the above formula (5). In these cases, it is possible to further increase the generation efficiency of the base.

A method of synthesizing a base proliferating agent having a base proliferating group represented by one of the above formulae (1) to (3) or a base proliferating agent represented by one of the above formulae (4) and (5) is not particularly limited. These base proliferating agents can be synthesized, for example, by an addition reaction between fluorenyl methanol and an isocyanate derivative, or by an addition reaction between an acrylate monomer having a fluorenylcarbamate group and a polythiol derivative. A base proliferating agent can be easily obtained by suitably using a tin catalyst for the former addition reaction or by suitably using a base catalyst for the latter addition reaction.

Examples of the isocyanate derivative used to obtain the base proliferating agent include copolymer containing methaxylene diisocyanate, tolylene diisocyanate, isophorone diisocyanate, 1,6-hexamethylene diisocyanate, 2-(meth)acryloyl oxyethylisocyanate, or 2-(meth)acryloyl oxyethylisocyanate. Each of these isocyanate derivatives may be used alone or two or more kinds thereof may be used in combination.

The base proliferating group represented by the above formula (1) is also preferably a base proliferating group represented by the following formula (6).

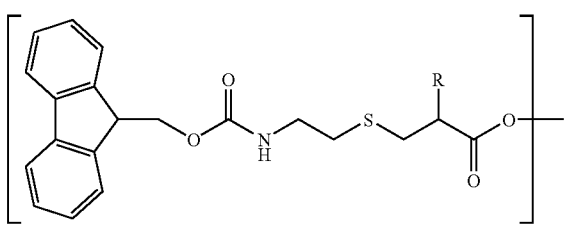

In the above formula (6), R represents hydrogen or a methyl group.

The base proliferating agent (D1) having a base proliferating group represented by the above formula (1) is more preferably a base proliferating agent that has a base proliferating group represented by the above formula (6) and an unsaturated group represented by the following formula (7).

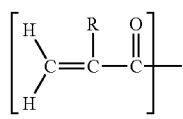

In the above formula (7), R represents hydrogen or a methyl group.

The base proliferating agent having a base proliferating group represented by the above formula (6) and an unsaturated group represented by the above formula (7) chemically binds to the crosslinking compound (A) by crosslinking. This causes the base proliferating agent to be incorporated into a cured product, and thereby suppresses the contamination due to the residual base proliferating agent.

The base proliferating agent having the base proliferating group represented by the above formula (6) can be obtained, for example, by an addition reaction between a compound having an unsaturated group represented by the above formula (7) and 9-fluorenylmethyl N-(2-mercaptoethyl)carbamate, as shown by the following reaction equation (X2). In this addition reaction, R in the above formula (6) is derived from R of an unsaturated group represented by the above formula (7).

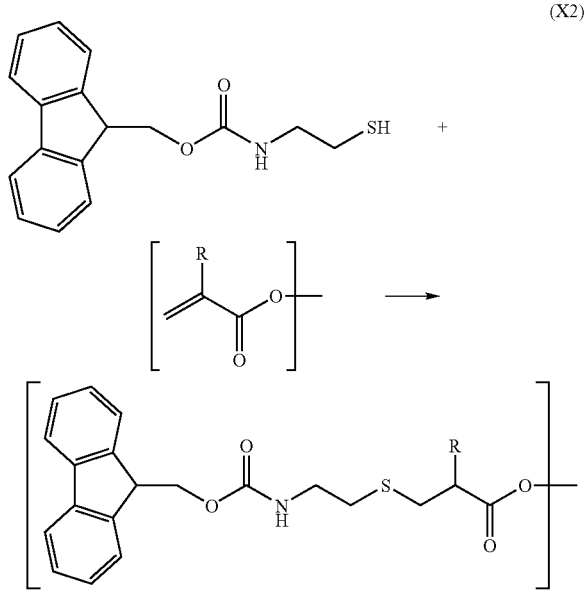

In the above equation (X2), R represents hydrogen or a methyl group.

The compound having an unsaturated group represented by the above formula (7) is a compound having an acrylate group or a methacrylate group (hereinafter, a combination of these is described as a (meth)acrylate group).

Examples of the compound having an unsaturated group represented by the above formula (7) include (meth)acrylate monomers and oligomers. These are listed in "Hikarikouka Gijutsu Handbook, Zairyo-hen (Photocuring Technology Handbook, Ingredient)" (published by TECHNO-NET, 2000).

When the base proliferating agent has many base proliferating groups represented by the above formula (6) in one molecule, the base multiplication reaction occurs efficiently. This tends to cause the crosslinking reaction of the crosslinking compound (A) such as an epoxy compound to proceed. Therefore, the base proliferating agent (D) is preferably a monomer or an oligomer which has at least two (meth)acrylate groups. A polyfunctional (meth)acrylate monomer described on pp. 20-42 and pp. 60-68 of "Hikarikouka Gijutsu Handbook Zairyou-hen" or a (meth)acrylate oligomer described on pp. 84-118 of the same handbook can be used as the above compound.

Specific examples of the polyfunctional (meth)acrylate monomer or the (meth)acrylate oligomer include ethylene di(meth)acrylate, 1,4-butanediol di(meth)acrylate, 1,6-hexanediol di(meth)acrylate, neopentyl glycol di(meth)acrylate, glycerol di(meth)acrylate, diethylene glycol di(meth)acrylate, triethylene glycol di(meth)acrylate, tetraethylene glycol di(meth)acrylate, polyethylene glycol di(meth)acrylate, dipropylene glycol di(meth)acrylate, tripropylene glycol di(meth)acrylate, cyclohexane dimethanol di(meth)acrylate, alkoxylated hexanediol di(meth)acrylate, alkoxylated cyclohexane di(meth)methanoldiacrylate, propoxylated neopentyl glycol di(meth)acrylate, di(meth)acryloylated isocyanurate, EO-modified bisphenol A di(meth)acrylate, trimethylolpropane tri(meth)acrylate, ethoxylated trimethylolpropane tri(meth)acrylate, propoxylated trimethylolpropane tri(meth)acrylate, pentaerythritol tri(meth)acrylate, caprolactone-modified tirmethylolpropane tri(meth)acrylate, EO-modified trimethylolpropane tri(meth)acrylate, tris(acryloyloxyethyl) isocyanurate, pentaerythritol tetra(meth)acrylate, pentaerythritol ethoxytetraacrylate, dipentaerythritol penta(meth)acrylate, dipentaerythritol hexa(meth)acrylate, caprolactone-modified dipentaerythritol hexa(meth)acrylate, polyester acrylate oligomer, epoxy acrylate, urethane(meth)acrylate, and analogues of these compounds.

A novolac-type compound, or a dendritic polyfunctional (meth)acrylate described in JP 11-193317 A can be used as the above polyfunctional (meth)acrylate monomer or the (meth)acrylate oligomer. Each of these may be used alone, or two or more kinds thereof may be used in combination.

A compound having at least two unsaturated groups represented by the above formula (7) may be used in order to increase the number of base proliferating groups represented by the above formula (6) in one molecule of the base proliferating agent.

In order to obtain such a compound having at least two unsaturated groups represented by the above formula (7), for example, α-thioglycerol is added to a compound having an unsaturated group represented by the above formula (7) to cause a Michael addition reaction between them. This converts the unsaturated group into a diol-substituted group which is represented by the following formula (8). Next, the hydroxyl group is esterified or urethanized. This reaction can cause, for example, one unsaturated group to be converted into two or four unsaturated groups as described later.

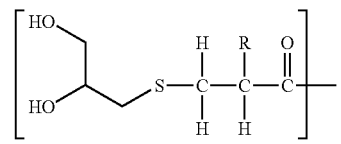

(8)

In the above formula (8), R represents hydrogen or a methyl group.

When a compound having at least two unsaturated groups represented by the above formula (7) is to be reacted with α-thioglycerol, the amount of α-thioglycerol is preferably 0.5 to 1.5 mol per 1 mol of the above unsaturated group. When all the unsaturated groups are to be converted into a group having a diol structure, which is represented by the above formula (8), the amount of α-thioglycerol is preferably 1.0 to 1.2 mol, and more preferably 1.0 mol per 1 mol of the above unsaturated group. A basic catalyst is preferably used to promote the reaction.

A tertiary amine is preferable as the above basic catalyst. Examples of the basic catalyst include triethylamine, tripropylamine, tributylamine, dimethylbenzylamine, N-methyldiethanolamine, pyridine, picoline, and lutidine. Also, a basic ion-exchange resin can be used as the above basic catalyst.

A reaction temperature in the above reaction for obtaining a compound having at least two unsaturated groups represented by the above formula (7) is preferably in the range of a room temperature (23° C.) to 150° C., and more preferably in the range of the room temperature to 100° C. A reaction time can be appropriately changed in accordance with the reaction temperature. The reaction time is preferably in the range of 10 minutes to 60 hours, and more preferably in the range of 1 hour to 50 hours.

As a method of introducing a (meth)acrylate group, which is an unsaturated group, to the hydroxyl group of a polyol compound having a group represented by the above formula (8), an esterification method or an urethanization method can be used.

In the esterification method, a (meth)acrylate group may be introduced using (meth)acryloyl chloride or (meth)acrylic anhydride in accordance with a common procedure. The esterification method is preferably a method of causing a dehydration-condensation reaction with a (meth)acrylic acid in the presence of an acid catalyst, as shown by the following reaction equation (X3). Water generated in this reaction can be removed by azeotroping or the like.

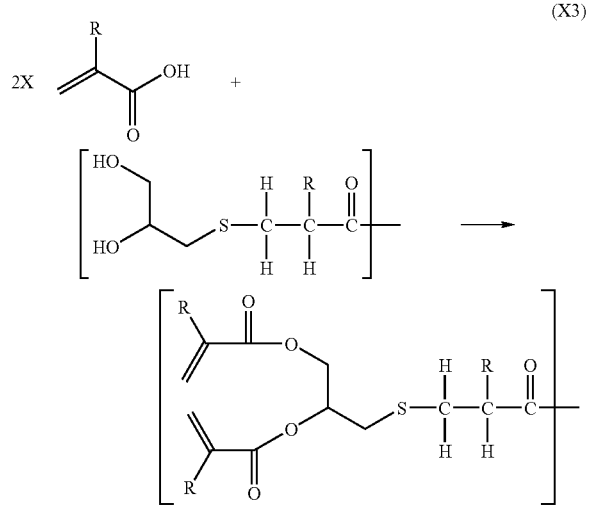

(X3)

In the above reaction equation (X3), R represents hydrogen or a methyl group.

In the urethanization method, an addition reaction with a (meth)acrylate derivative that has an isocyanato group is used. Examples of the isocyanate compound used for this reaction include 2-isocyanate ethylacrylate (Karenz AOI produced by Showa Denko K.K.), 2-isocyanate ethyl methacrylate (Karenz MOI produced by Showa Denko K.K.), and 1,3-diacryloyloxy-2-isocyanate-2-methylpropane (Karenz BEI produced by Showa Denko K.K.).

The amount of the isocyanate compound is preferably 0.5 to 2.0 mol, more preferably 0.5 to 1.5 mol, and still more preferably 1.0 to 1.2 mol per 1 mol of the hydroxyl group of the polyol compound having a group represented by the above formula (8).

In order to promote the addition reaction in a solvent with the above polyol compound at least partially dissolved therein, the basic catalyst used in the addition reaction for diol substitution can be used. A catalyst such as di-n-butyltin dilaurate may be further used. Further, a polymerization inhibitor is preferably used so as to suppress a polymerization reaction. A reaction temperature is preferably in the range of the room temperature to 100° C., and more preferably in the range of 40° C. to 80° C. A reaction time can be appropriately changed in accordance with the reaction temperature. The reaction time is preferably in the range of 30 minutes to 20 hours, and more preferably in the range of 1 hour to 15 hours.

When an excess of the isocyanate compound is to be removed after completion of the reaction, N,N-dimethylethanolamine, for example, is added to the reaction solution to react with the excess of the isocyanate compound. Then, washing with an acid aqueous solution, or adsorption with an acid ion-exchange resin may be performed. In the above addition reaction, the isocyanato group reacts with the hydroxyl group in the group represented by the above formula (8) to form a urethane bond. Accordingly, use of 2-isocyanatoethyl(meth)acrylate leads to introduction of one unsaturated group to one hydroxyl group, as shown in the following reaction equation (X4).

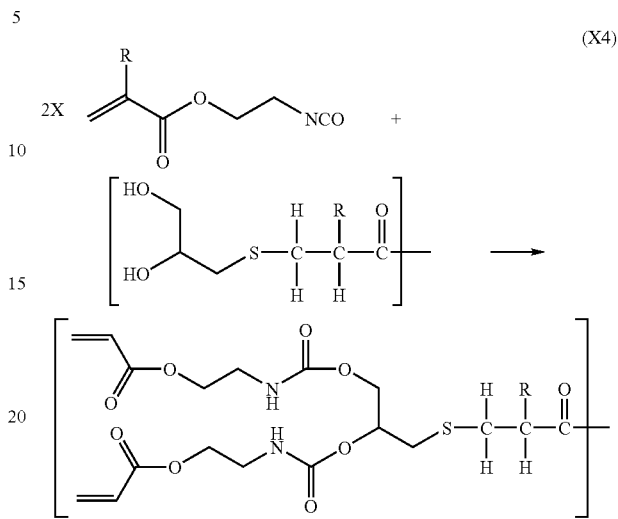

(X4)

In the above reaction equation (X4), R represents hydrogen or a methyl group.

Use of 1,3-di(meth)acryloyloxy-2-isocyanate-2-methylpropane leads to introduction of two unsaturated groups to one hydroxyl group, as shown in the following reaction equation (X5). In the reaction equation (X4), the structure having two branches similar to the structure of the above reaction equation (X3) can be obtained. In the following reaction equation (X5), a structure having four branches can be obtained in one step because two acrylate groups are introduced into one hydroxyl group.

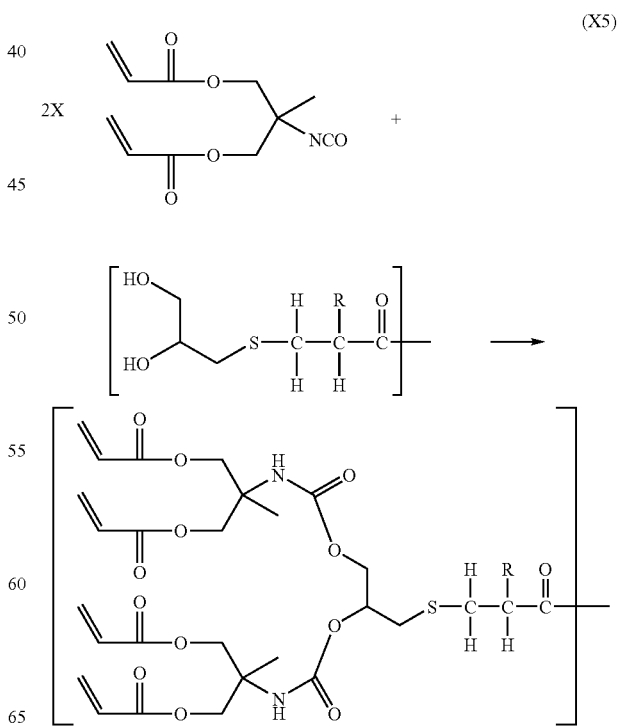

(X5)

In the above reaction equation (X5), R represents hydrogen or a methyl group.

As shown in the above reaction equations (X3) to (X5), a plurality of unsaturated groups represented by the above formula (7) are regenerated by esterifying or urethanizing the hydroxyl group in a group represented by the formula (8). A further addition reaction between the regenerated unsaturated groups and α-thioglycerol makes it possible to introduce even more hydroxyl groups. This means that a dendrimer is produced in which repetition of a Michael addition reaction between the unsaturated group and α-thioglycerol and a reaction introducing a (meth)acryloyl group to the hydroxyl group after the Michael addition reaction corresponds to the number of generations. The respective reactions make it possible to produce a dendrimer in which a (meth)acryloyl group is introduced to an end of a molecular chain. Therefore, it is possible to obtain a compound having a plurality of unsaturated groups represented by the above formula (7) at an end of a molecular chain.

An addition reaction between the compound having an unsaturated group represented by the formula (7) and 9-fluorenylmethyl-N-(2-mercaptoethyl)carbamate is preferably used to convert the unsaturated group represented by the above formula (7) into the base proliferating group represented by the above formula (6).

9-fluorenylmethyl-N-(2-mercaptoethyl)carbamate having a mercapto group easily reacts with the compound having an unsaturated group represented by the above formula (7) to cause a Michael addition reaction. Hence, it is possible to easily obtain a compound having a base proliferating group represented by the above formula (6).

When a compound having at least two unsaturated groups represented by the above formula (7) in one molecule is to be used for a reaction between a compound having an unsaturated group represented by the above formula (7) and 9-fluorenylmethyl-N-(2-mercaptoethyl)carbamate, all the unsaturated groups may be reacted with a mercapto compound, or a part of the unsaturated groups may be reacted with the mercapto compound. In a compound having a base proliferating group represented by the above formula (6) and an unsaturated group represented by the above formula (7) in one molecule, an addition reaction occurs between an amino group generated from the base proliferating group and the unsaturated group. Accordingly, the compound itself, which has the base proliferating group and the unsaturated group in one molecule, expresses a curing reaction.

The usage ratio of the unsaturated group represented by the above formula (2) and 9-fluorenylmethyl-N-(2-mercaptoethyl)carbamate can be appropriately changed in accordance with the conversion rate of the unsaturated group. Use of 1.0 to 1.5 mol of 9-fluorenylmethyl-N-(2-mercaptoethyl)carbamate is preferable per 1 mol of the unsaturated group represented by the above formula (2). In order to efficiently proceed with this reaction, a basic catalyst is preferably used.

The basic catalyst for converting the unsaturated group into the base proliferating group is preferably a tertiary amine. Examples of the basic catalyst include triethylamine, tripropylamine, tributylamine, dimethylbenzylamine, N,N-diisopropylmethylamine, N,N-dicyclohexylmethylamine, N-methyldiethanolamine, pyridine, picoline, lutidine, and basic ion-exchange resins. A reaction temperature in the reaction of converting the unsaturated group into the base proliferating group is preferably in the range of the room temperature to 150° C., and more preferably in the range of the room temperature to 100° C. A reaction time can be appropriately changed in accordance with the reaction temperature. The reaction time is preferably in the range of 10 minutes to 60 hours, and more preferably in the range of 1 hour to 50 hours.

The compounding ratio of the base proliferating agent (D) is preferably in the range of 20 to 100 parts by weight per 100 parts by weight of the crosslinking compound (A). A too small amount of the base proliferating agent (D) may lead to insufficient generation of a base in the base multiplication reaction. On the other hand, a too large amount of the base proliferating agent (D) may lead to precipitation of the base proliferating agent.

(Other Components which can be Added)

The photocurable pressure-sensitive adhesive composition according to the present invention may comprise an appropriate solvent. A photocurable pressure-sensitive adhesive composition comprising a solvent can increase the application property.

The above solvent is not particularly limited, and the specific examples thereof include aromatic hydrocarbon compounds, saturated or unsaturated hydrocarbon compounds, ethers, ketones, and esters. Each of these solvents may be used alone, or two or more kinds thereof may be used in combination.

Examples of the aromatic hydrocarbon compounds include benzene, xylene, toluene, ethylbenzene, stylene, trimethylbenzene, and diethylbenzene. Examples of the saturated or unsaturated hydrocarbon compounds include cyclohexane, cyclohexane, dipentene, n-pentane, isopentane, n-hexane, isohexane, n-heptane, isoheptane, n-octane, isooctane, n-nonane, isononane, n-decane, isodecane, tetrahydronaphthalene, and squalane. Examples of the ethers include diethyl ether, di-n-propyl ether, di-isopropyl ether, dibutyl ether, ethylpropyl ether, diphenyl ether, diethylene glycol dimethyl ether, diethylene glycol diethyl ether, diethylene glycol dibutyl ether, diethylene glycol methyl ethyl ether, dipropylene glycol dimethyl ether, dipropylene glycol diethyl ether, dipropylene glycol dibutyl ether, dipropylene glycol methyl ethyl ether, ethylene glycol dimethyl ether, ethylene glycol diethyl ether, ethylene glycol dipropyl ether, ethylene glycol methyl ethyl ether, tetrahydrofuran, 1,4-dioxane, propylene glycol monomethyl ether acetate, ethylene glycol monoethyl ether acetate, dipropylene glycol methyl ether acetate, diethylene glycol monoethyl ether acetate, ethylcyclohexane, methylcyclohexane, p-menthane, o-menthane, m-menthane, dipropylether, and dibutylether. Examples of the ketones include acetone, methyl ethyl ketone, methyl isobutyl ketone, diethyl ketone, dipropyl ketone, methyl amyl ketone, cyclopentanone, cyclohexanone, and cycloheptanone. Examples of the esters include ethyl acetate, methyl acetate, butyl acetate, propyl acetate, cyclohexyl acetate, methyl cellosolve acetate, ethyl cellosolve acetate, butyl cellosolve acetate, ethyl lactate, propyl lactate, butyl lactate, isoamyl lactate, and butyl stearate.

Further, the photocurable pressure-sensitive adhesive composition according to the present invention may comprise a thickening agent, a thixotropic agent, a weighting agent, or an adjuster so as to increase the application property.

Examples of the thickening agent include acrylic rubber, epichlorohydrin rubber, isoprene rubber, and butyl rubber. Examples of the thixotropic agent include colloidal silica and polyvinyl pyrolidone. Examples of the weighting agent include calcium carbonate, titanium oxide, and clay. Examples of the adjuster include polyester, (meth)acrylic polymer, polyurethane, silicone, polyether, polyvinyl ether, polyvinyl chloride, polyvinyl acetate, polyisobutylene, and wax.

Further, when the photocurable pressure-sensitive adhesive composition according to the present invention is used for an adhesive, an inorganic hollow body, an organic sphere, an organic hollow body, a single fiber, or a carbon nanotube may be used to obtain high shear adhesion.

Examples of the inorganic hollow body include glass balloons, alumina balloons, and ceramic balloons. Examples of the organic sphere include nylon beads, acrylic beads, and silicone beads. Examples of the organic hollow body include vinylidene chloride balloons and acrylic balloons. Examples of the single fiber include glass, polyester, rayon, nylon, cellulose, and acetate.

When glass is to be used as the single fiber, a fibrous chip made of a glass fiber can be added to the composition. Impregnating a glass woven fabric with the photocurable pressure-sensitive adhesive composition and polymerizing make it possible to obtain high shear adhesion.

Further, the photocurable pressure-sensitive adhesive composition preferably further comprises a photo-sensitizer (E) because it can increase the photosensitivity. Examples of the photo-sensitizer include 9,10-dibutoxyanthracene, anthracene, perylene, coronene, tetracene, benzanthracene, phenothiazine, flavin, acridine, ketocoumarin, thioxanthone derivatives, benzophenone, acetophenone, 2-chloro thioxanthone, 2,4-dimethyl thioxanthone, 2,4-diethyl thioxanthone, 2,4-diisopropyl thioxanthone, and isopropyl thioxanthone.

The producing method of the photocurable pressure-sensitive adhesive composition according to the present invention is not particularly limited. Specific examples of the producing method of the photocurable pressure-sensitive adhesive composition include methods of melt blending the respective components of the crosslinking compound (A), the photobase generator (B), and the tackifying component (C), and methods of dissolving the respective components in a solvent.

The photocurable pressure-sensitive adhesive composition according to the present invention may be provided in a form of a double faced pressure-sensitive adhesive tape molded into a sheet shape. Further, the photocurable pressure-sensitive adhesive composition may be applied on one side of a substrate when used. The photocurable pressure-sensitive adhesive composition may be applied on both sides of the substrate to form a double faced pressure-sensitive adhesive tape. Alternatively, the photocurable pressure-sensitive adhesive composition may be applied to a partial region of the substrate.

In order to mold the photocurable pressure-sensitive adhesive composition into a sheet shape, the photocurable pressure-sensitive adhesive composition may be applied and molded in accordance with a known application method such as hot melt coating or cast coating.

The above substrate is not particularly limited. Specific examples of the substrate include unwoven fabrics, films or sheets made of synthetic resin, foams, synthetic resin boards made of synthetic resin, sheets or boards made of metal, glass, ceramic, lumber, paper, and fabrics. The shape of the substrate is not limited to a sheet or board shape which has a small thickness. The base may have a prismatic shape, a rodlike shape, or a shape with an aspheric surface.

Examples of the unwoven fabric include rayon unwoven fabrics and cellulose unwoven fabrics. Examples of the films or sheets made of synthetic resin include films or sheets made of respective synthetic resins such as polyethylene, polyester, polystyrene, cellophane, polypropylene, and polyimide. Examples of the foams include polyethylene foams, urethane foams, and vinyl chloride foams. Examples of the synthetic resin boards made of synthetic resin include synthetic resin boards made of synthetic resin such as polyethylene, polyester, polystyrene, acrylic, ABS, polypropylene, hard vinyl chloride, and polycarbonate. Examples of the sheets or boards made of metal include sheets or boards made of metal such as steel, stainless steel, aluminum, copper, or a galvanized steel plate.

When members are to be bonded with the photocurable pressure-sensitive adhesive composition according to the present invention, the photocurable pressure-sensitive adhesive composition is applied to at least one of the members, or the photocurable pressure-sensitive adhesive composition in a tape form is attached to at least one of the members. Before being applied or attached, or after being applied or attached, the photocurable pressure-sensitive adhesive composition is irradiated with light having a wavelength region preferably in the range of 300 nm or more to less than 800 nm, with the light intensity of 5 mW/cm$^2$ or more. Then, the two members are bonded. A light intensity of less than 5 mW/cm$^2$ may make it difficult to sufficiently generate a base from the photobase generator (B).

Examples of the light source for curing the photocurable pressure-sensitive adhesive composition according to the present invention include excimer lasers, excimer lamps, low-pressure mercury-vapor lamps, medium-pressure mercury-vapor lamps, high-pressure mercury-vapor lamps, extra-high-pressure mercury-vapor lamps, chemical lamps, black light lamps, microwave excitation mercury-vapor lamps, metal halide lamps, fluorescent lamps, and natural light such as sunlight.

The present invention will be described in detail in the following with Examples. However, the present invention is not limited to these Examples.

Synthesis Example 1

Resin 1

Ethyl acrylate 600 g (produced by Nippon Shokubai Co., Ltd.), lauryl mercaptane 1 g (produced by Wako Pure Chemical Industries, Ltd.), and toluene 600 g were put into a 2 liter separable flask provided with a stirrer, a condenser, a thermometer, and a nitrogen-gas introducing port to give a monomer mixture solution. The obtained monomer mixture solution was subjected to nitrogen bubbling for 20 minutes, and thereby dissolved oxygen was removed. Thereafter, the atmosphere in the separable flask was substituted by nitrogen gas. Then, the temperature in the separable flask was raised with an oil bath with the solution stirred until the solution was to be a reflux state.

After the solution had been in a reflux state, a solution of azobisisobutylonitrile (AIBN) 0.05 g in toluene 1 g was added to the mixture for polymerization as a polymerization initiator. An hour later, another solution of AIBN 0.05 g in toluene 1 g was further added thereto. Solutions of AIBN 0.3 g, 0.7 g, and 2 g in toluene 5 g were successively added 2, 3, and 4 hours after the start of the polymerization, respectively. As 7 hours had passed since the first addition of the polymerization initiator, the inside of the separable flask was cooled down to room temperature, and thereby the polymerization was terminated. Thus, a 50 wt % toluene solution of Resin 1 (a number average molecular weight: 50000, molecular weight converted as the molecular weight of polystyrene, which is determined by gel permeation chromatography) was provided.

Synthesis Example 2

Resin 2

Ethyl acrylate 550 g (produced by NIPPON SHOKUBAI CO., LTD.), acrylamide 50 g (produced by Wako Pure Chemical Industries, Ltd.), lauryl mercaptane 1 g (produced by Wako Pure Chemical Industries, Ltd.), and toluene 600 g were put into a 2 liter separable flask provided with a stirrer, a condenser, a thermometer, and a nitrogen-gas introducing port to give a monomer mixture solution. The obtained monomer mixture solution was subjected to nitrogen bubbling for 20 minutes, and thereby dissolved oxygen was removed. Thereafter, the atmosphere in the separable flask was substituted by nitrogen gas. Then, the temperature in the separable flask was raised with an oil bath with the solution stirred until the solution was to be a reflux state.

After the solution had been in a reflux state, a solution of azobisisobutylonitrile (AIBN) 0.05 g in toluene 1 g was added to the mixture for polymerization as a polymerization initiator. An hour later, another solution of AIBN 0.05 g in toluene 1 g was further added thereto. Solutions of AIBN 0.3 g, 0.7 g, and 2 g in toluene 5 g were successively added 2, 3, and 4 hours after the start of the polymerization, respectively. As 7 hours had passed since the first addition of the polymerization initiator, the inside of the separable flask was cooled down to room temperature, and thereby the polymerization was terminated. Thus, a 50 wt % toluene solution of Resin 2 (a number average molecular weight: 50000, molecular weight converted as the molecular weight of polystyrene, which is determined by gel permeation chromatography) was provided.

Example 1

Bisphenol A type epoxy resin 30 g (EPIKOTE 834, produced by Japan Epoxy Resins Co., Ltd.), PBG-2 30 g (serving as the aforementioned photobase generator), and a 50 wt % solution of Resin 1 in toluene 80 g were stirred to be uniformly mixed in a 0.5 liter separable flask to provide a photocurable pressure-sensitive adhesive composition.

(Evaluations)

The photocurable pressure-sensitive adhesive composition was applied to a polyethylene terephthalate film having a release-treated surface (PET5011, produced by LINTEC Corp., and referred to as a PET film hereinafter) with an applicator such that the thickness of the applied composition was to be 150 μm. The composition-applied film was placed in a drying oven at 100° C. for 30 minutes to remove toluene from the photocurable pressure-sensitive adhesive composition. Thus, a double-faced pressure-sensitive adhesive tape comprising the photocurable pressure-sensitive adhesive composition was formed on the PET film. The obtained double-faced pressure-sensitive adhesive tape was evaluated on (1) shear adhesion, (2) thermal creep resistance, (3) adhesion force to an aluminum plate, (4) adhesion force to a cold-reduced carbon steel plate (SPCC), (5) adhesion force to a copper plate, (6) releasability of a release-treated PET film, and (7) cast-film formability.

(1) Evaluation of Shear Adhesion

A laminated body of the PET film and the double-faced pressure-sensitive adhesive tape was cut to have a 25 mm×25 mm square plane shape. A stainless steel plate (25 mm×120 minx 2 mm, hereinafter referred to as a test plate A) was provided and the surface thereof was washed by alcohol for removing dusts, fats and oils thereon. The cut laminated body was stuck on the test plate A such that the double-faced pressure-sensitive adhesive tape was in contact with the test plate A. The laminated body was irradiated with a 365 nm light by using a high-pressure mercury-vapor lamp such that an irradiation energy was to be 1500 mJ/cm². Then, the PET film was released and the double-faced pressure-sensitive adhesive tape was exposed. Thereafter, another test plate A was separately prepared and was stuck to the exposed face of the double-faced pressure-sensitive adhesive tape from which the PET film had been released, and thereby a combined body was provided. The thus obtained combined body was cured at 23° C. for 24 hours. The combined body was further cured at 23° C. for 7 days.

Maximum breaking strengths of the combined body before and after the curing were measured with a tensile testing apparatus under the conditions of 23° C. and 10 mm/minute in a cross head speed. The maximum breaking strengths were evaluated as shear adhesion.

(2) Evaluation of Thermal Creep Resistance

The combined body produced in the evaluation of shear adhesion was prepared, and was cured at 23° C. for 7 days. The combined body was held at one end to be hunged at 80° C., and was left with a load of 1 kgf applied by a weight on the other end. Then, elapsed time was recorded as the weight dropped. In the case where the weight did not drop even after 24 hours, thermal creep resistance was evaluated as "no dropping".

(3) Evaluation of Adhesion Force to Aluminum Plate

Except that an aluminum plate was used instead of the test plate A, a combined body was prepared in the same manner as in the evaluation of shear adhesion. The combined body was cured at 23° C. for 7 days, and then a maximum breaking strength was measured in the same manner as in the evaluation of shear adhesion. The maximum breaking strength was evaluated as adhesion force to an aluminum plate.

(4) Evaluation of Adhesion Force to Cold-Reduced Carbon Steel Plate (SPCC)

Except that a cold-reduced carbon steel plate (SPCC) was used instead of the test plate A, a combined body was prepared in the same manner as in the evaluation of shear adhesion. The combined body was cured at 23° C. for 7 days, and then a maximum breaking strength was measured in the same manner as in the evaluation of shear adhesion. The maximum breaking strength was evaluated as adhesion force to a cold-reduced carbon steel plate (SPCC).

(5) Evaluation of Adhesion Force to Copper Plate

Except that a copper plate was used instead of the test plate A, a combined body was prepared in the same manner as in the evaluation of shear adhesion. The combined body was cured at 23° C. for 7 days, and then a maximum breaking strength was measured in the same manner as in the evaluation of shear adhesion. The maximum breaking strength was evaluated as adhesion force to a copper plate.

(6) Evaluation of Releasability of Release-Treated PET Film

A laminated body of the release-treated PET film and the double-faced pressure-sensitive adhesive tape was cut in a size of 25 mm in width×12 mm in length. Then, a stainless steel plate was stuck to the double-faced pressure-sensitive adhesive tape on the release-treated PET film. The end of the release-treated PET film was picked up to start releasing the film. When the release-treated PET film was released, the transfer condition of the double-faced pressure-sensitive adhesive tape to the stainless steel plate was evaluated as follows.

⊚: The release-treated PET film was easily released, and the double-faced pressure-sensitive adhesive tape was transferred to the stainless steel plate with very little cohesive failure.

o: Cohesive failure was observed in the double-faced pressure-sensitive adhesive tape transferred to the stainless steel plate at a ratio of 5% to less than 20% in terms of the transferred area.

Δ: Cohesive failure was observed in the double-faced pressure-sensitive adhesive tape transferred to the stainless steel plate at a ratio of 20% to less than 40% in terms of the transferred area.

x: Cohesive failure was observed in the double-faced pressure-sensitive adhesive tape transferred to the stainless steel plate at a ratio of 40% or more in terms of the transferred area.

(7) Evaluation of Cast-Film Formability

The thickness of the double-faced pressure-sensitive adhesive tape formed on the PET film was measured with a thickness gauge. Difference between the maximum value and the minimum value of the thickness was calculated, and cast-film formability was evaluated as follows.

o: Difference in thickness was less than 10 μm.

Δ: Difference in thickness was not less than 10 μm and less than 50 μm.

x: Difference in thickness was 50 μm or more.

Examples 2 to 5 and Comparative Example 1

Except that the materials shown in Table 1 were used, the photocurable pressure-sensitive adhesive composition was produced in the same manner as in Example 1. The obtained photocurable pressure-sensitive adhesive composition was evaluated in the same manner as in Example 1.

Table 1 shows the results.

TABLE 1

|  |  |  |  | Examples ||||| Comp. Ex. |
|---|---|---|---|---|---|---|---|---|---|
|  |  |  |  | 1 | 2 | 3 | 4 | 5 | 1 |
| Ingredients | Compounds (A) | Bisphenol A type epoxy resin (EPIKOTE 834, produced by Japan Epoxy Resins Co., Ltd.) | Parts by Weight | 30 | 30 | 30 | 15 |  | 60 |
|  |  | Bisphenol A type epoxy resin (EPIKOTE 100, produced by Japan Epoxy Resins Co., Ltd.) | Parts by Weight |  |  |  | 15 |  |  |
|  |  | Tolylene diisocyanate (TDI, produced by Wako Pure Chemical Industries, Ltd.) | Parts by Weight |  |  |  |  | 20 |  |
|  | Compound (B) | PBG-2 | Parts by Weight | 30 | 30 | 15 | 20 | 20 |  |
|  | Compounds (C) | Resin 1 (solid), polyethyl acrylate, Mn: 50000 | Parts by Weight | 40 |  |  | 60 | 60 |  |
|  |  | Resin 2 (solid), polyacrylamide copolymer, Mn 50000 | Parts by Weight |  | 40 | 40 |  |  | 40 |
|  | Compound (D) | Flu3 | Parts by Weight |  |  | 15 |  |  |  |
|  | Other Ingredient | Photo cationic catalyst (SP-170, produced by ADEKA Corp.) | Parts by Weight |  |  |  |  |  | 1 |
| Evaluations | (1) Shear Adhesion | Immediately After the Sticking | kgf/cm² | 0.1 | 0.3 | 0.3 | 0.2 | 0.1 | 0.3 |
|  |  | 24 Hours After the Sticking | kgf/cm² | 1.5 | 3.6 | 4.9 | 4.1 | 8.1 | 0.3 |
|  |  | 7 Days After the Sticking | kgf/cm² | 11 | 15 | 19 | 17 | 16 | 0.4 |
|  | (2) Thermal Creep Resistance | 7 Days After the Sticking | *1 | No Dropping | No Dropping | No Dropping | No Dropping | No Dropping | 1 minute |
|  | (3) Adhesion Force to Aluminum Plate |  | kgf/cm² | 10 | 16 | 14 | 19 | 25 | 0.5 |
|  | (4) Adhesion Force to Cold-Reduced Carbon Steel Plate (SPCC) |  | kgf/cm² | 12 | 21 | 15 | 18 | 21 | 0.3 |
|  | (5) Adhesion Force to Copper Plate |  | kgf/cm² | 11 | 20 | 13 | 16 | 19 | 0.4 |
|  | (6) Reusability of Release PET Film |  |  | ○ | ○ | ◎ | ◎ | ◎ | ◎ |
|  | (7) Cast-Film Formability |  |  | ○ | ○ | ○ | ○ | ○ | ○ |

*1: Elapsed Time for Dropping

Synthesis Example 3

Resin 3

Except that the amount of lauryl mercaptane was changed to 2 g from 1 g, a 50 wt % toluene solution of Resin 3 (a number average molecular weight: 20000) was produced in the same manner as in Synthesis Example 1.

Synthesis Example 4

Resin 4

Except that the amount of lauryl mercaptane was changed to 0.6 g from 1 g, a 50 wt % toluene solution of Resin 4 (a number average molecular weight: 80000) was produced in the same manner as in Synthesis Example 1.

Synthesis Example 5

Resin 5

Except that the amount of lauryl mercaptane was changed to 0.3 g from 1 g, a 50 wt % toluene solution of Resin 5 (a number average molecular weight: 101000) was produced in the same manner as in Synthesis Example 1.

Synthesis Example 6

Resin 6

Except that the amount of lauryl mercaptane was changed to 0.1 g from 1 g, a 50 wt % toluene solution of Resin 6 (a number average molecular weight: 187000) was produced in the same manner as in Synthesis Example 1.

Synthesis Example 7

Resin 7

Except that the amount of lauryl mercaptane was changed to 0.05 g from 1 g, a 50 wt % toluene solution of Resin 7 (a number average molecular weight: 221000) was produced in the same manner as in Synthesis Example 1.

Synthesis Example 8

Resin 8

Except that the amount of lauryl mercaptane was changed to 0.02 g from 1 g, a 50 wt % toluene solution of Resin 8 (a number average molecular weight: 483000) was produced in the same manner as in Example 1.

Synthesis Example 9

Resin 9

Except that the amount of lauryl mercaptane was changed to 0.01 g from 1 g, a 50 wt % toluene solution of Resin 9 (a number average molecular weight: 650000) was produced in the same manner as in Synthesis Example 1.

Synthesis Example 10

Resin 10

Except that lauryl mercaptane was not used, a 50 wt % toluene solution of Resin 10 (a number average molecular weight: 840000) was produced in the same manner as in Synthesis Example 1.

Synthesis Example 11

Resin 11

Except that ethyl acrylate 400 g (produced by Nippon Shokubai Co., Ltd.) and acrylonitrile 200 g (produced by Wako Pure Chemical Industries, Ltd.) were used instead of ethyl acrylate 600 g, and that the amount of lauryl mercaptane was changed to 0.3 g from 1 g, a 50 wt % toluene solution of Resin 11 (a number average molecular weight: 120000) was produced in the same manner as in Synthesis Example 1.

Synthesis Example 12

Resin 12

Except that ethyl acrylate 400 g (produced by Nippon Shokubai Co., Ltd.) and N-vinyl pyrrolidone 200 g (produced by Wako Pure Chemical Industries, Ltd.) were used instead of ethyl acrylate 600 g, and that the amount of lauryl mercaptane was changed to 0.3 g from 1 g, a 50 wt % toluene solution of Resin 12 (a number average molecular weight: 143000) was produced in the same manner as in Synthesis Example 1.

Synthesis Example 13

Resin 13

Except that ethyl acrylate 400 g (produced by Nippon Shokubai Co., Ltd.) and 2-hydroxyethyl methacrylate 200 g (produced by Wako Pure Chemical Industries, Ltd.) were used instead of ethyl acrylate 600 g, and that the amount of lauryl mercaptane was changed to 0.3 g from 1 g, a 50 wt % toluene solution of Resin 13 (a number average molecular weight: 143000) was produced in the same manner as in Synthesis Example 1.

Synthesis Example 14

PBG-KA as photobase generator (B)

Ketoprofen 20 g (produced by Tokyo Chemical Industry Co., Ltd.) and 1,3-di-4-piperidylpropane 8.2 g (produced by Tokyo Chemical Industry Co., Ltd.) were mixed in methanol, and then stirred at room temperature for 24 hours to react with each other. The methanol was removed with an evaporator, and the obtained crude product was recrystallized with ethanol/hexane to provide a compound which is a ketoprofen amine salt-type photobase generator (referred to as PBG-KA).

Synthesis Example 15

Resin 14

Except that ethyl acrylate 550 g (produced by Nippon Shokubai Co., Ltd.) and glycidyl methacrylate 50 g (GMA, produced by Wako Pure Chemical Industries, Ltd.) were used instead of ethyl acrylate 600 g, and that the amount of lauryl mercaptane was changed to 3 g from 1 g, a 50 wt % toluene solution of Resin 14 (a number average molecular weight: 7000) was produced in the same manner as in Synthesis Example 1.

Synthesis Example 16

Resin 15

Except that ethyl acrylate 550 g (produced by Nippon Shokubai Co., Ltd.) and 2-methacryloyloxyethyl isocyanate 50 g (Karenz MOI, produced by Showa Denko K.K.) were used instead of ethyl acrylate 600 g, and that the amount of lauryl mercaptane was changed to 3 g from 1 g, a 50 wt % toluene solution of Resin 15 (a number average molecular weight: 6500) was produced in the same manner as in Synthesis Example 1.

Synthesis Example 17

Resin 16

Except that ethyl acrylate 550 g (produced by Nippon Shokubai Co., Ltd.) and 3-acryloyloxytrimethoxysilane 50 g (KBM-5103, produced by Shin-Etsu Chemical Co., Ltd.) were used instead of ethyl acrylate 600 g, and that the amount of lauryl mercaptane was changed to 3 g from 1 g, a 50 wt % toluene solution of Resin 16 (a number average molecular weight: 6800) was produced in the same manner as in Synthesis Example 1.

Synthesis Example 18

Resin 17

Except that ethyl acrylate 500 g (produced by Nippon Shokubai Co., Ltd.) and 3-acryloyloxytrimethoxysilane 100 g (KBM-5103, produced by Shin-Etsu Chemical Co., Ltd.) were used instead of ethyl acrylate 600 g, and that the amount of lauryl mercaptane was changed to 3 g from 1 g, a 50 wt % toluene solution of Resin 17 (a number average molecular weight: 6800) was produced in the same manner as in Synthesis Example 1.

Synthesis Example 19

Resin 18

Except that ethyl acrylate 550 g (produced by Nippon Shokubai Co., Ltd.) and maleic anhydride 50 g (produced by Wako Pure Chemical Industries, Ltd.) were used instead of ethyl acrylate 600 g, and that the amount of lauryl mercaptane was changed to 3 g from 1 g, a 50 wt % toluene solution of Resin 18 (a number average molecular weight: 7100) was produced in the same manner as in Synthesis Example 1.

Examples 6 to 35 and Comparative Examples 2 to 4

Except that the materials shown in Tables 2 to 4 were used, a photocurable pressure-sensitive adhesive composition was provided in the same manner as in Example 1. The provided photocurable pressure-sensitive adhesive composition was evaluated in the same manner as in Example 1.
Tables 2 to 4 show the results.

TABLE 2

|  |  |  |  | Examples | | | | |
|---|---|---|---|---|---|---|---|---|
|  |  |  |  | 6 | 7 | 8 | 9 | 10 |
| Ingredients | Compounds (A) | Bisphenol A type epoxy resin (EPIKOTE 834, produced by Japan Epoxy Resins Co., Ltd.) | Parts by Weight | 30 | 30 | 30 | 30 | 30 |
|  |  | Bisphenol A type epoxy resin (EPIKOTE 100, produced by Japan Epoxy Resins Co., Ltd.) | Parts by Weight |  |  |  |  |  |
|  |  | Tolylene diisocyanate (TDI, produced by Wako Pure Chemical Industries, Ltd. | Parts by Weight |  |  |  |  |  |
|  |  | Resin 14 (solid), GMA-copolymerized acryl resin | Parts by Weight |  |  |  |  |  |
|  |  | Resin 15 (solid), MOI-copolymerized acryl resin | Parts by Weight |  |  |  |  |  |
|  |  | Dipentaerythritol hexaacrylate (LIGHT-ACRYLATE DPE-6A, produced by Kyoeisha Chemical Co., Ltd.) | Parts by Weight |  |  |  |  |  |
|  |  | Resin 16 (solid), alkoxysilylated acryl resin 1 | Parts by Weight |  |  |  |  |  |
|  |  | Resin 17 (solid), alkoxysilylated acryl resin 2 | Parts by Weight |  |  |  |  |  |
|  |  | Resin 18 (solid), maleic anhydride-copolymerized acryl resin | Parts by Weight |  |  |  |  |  |
|  | Compounds (B) | PBG-2 | Parts by Weight | 30 | 30 | 30 | 30 | 30 |
|  |  | PBG-KA, ketoprofen type photobase generator | Parts by Weight |  |  |  |  |  |
|  | Compounds (C) | Resin 1 (solid), polyethyl acrylate, Mn: 50000 | Parts by Weight |  |  |  |  |  |
|  |  | Resin 2 (solid), polyacrylamide copolymer, Mn 50000 | Parts by Weight |  |  |  |  |  |
|  |  | Resin 3 (solid), polyethyl acrylate, Mn: 20000 | Parts by Weight | 40 |  |  |  |  |
|  |  | Resin 4 (solid), polyethyl acrylate, Mn: 80000 | Parts by Weight |  | 40 |  |  |  |
|  |  | Resin 5 (solid), polyethyl acrylate, Mn: 101000 | Parts by Weight |  |  | 40 |  |  |
|  |  | Resin 6 (solid), polyethyl acrylate, Mn: 187000 | Parts by Weight |  |  |  | 40 |  |

TABLE 2-continued

| | | | | | | | | |
|---|---|---|---|---|---|---|---|---|
| | | Resin 7 (solid), polyethyl acrylate, Mn: 221000 | Parts by Weight | | | | | 40 |
| | | Resin 8 (solid), polyethyl acrylate, Mn: 483000 | Parts by Weight | | | | | |
| | | Resin 9 (solid), polyethyl acrylate, Mn: 650000 | Parts by Weight | | | | | |
| | | Resin 10 (solid), polyethyl acrylate, Mn: 840000 | Parts by Weight | | | | | |
| | | Resin 11 (solid), polyacrylonitrile copolymer, Mn: 120000 | Parts by Weight | | | | | |
| | | Resin 12 (solid), polyvinyl pyrrolidone copolymer, Mn: 143000 | Parts by Weight | | | | | |
| | | Resin 13 (solid), HEMA copolymer, Mn: 143000 | Parts by Weight | | | | | |
| | | Polyester (VYLON GK780, produced by Toyobo Co., Ltd.) | Parts by Weight | | | | | |
| | | Polyurethane (NIPPOLLAN 5199, produced by Nippon Polyurethane Industry Co., Ltd.) | Parts by Weight | | | | | |
| | Compound (D) | Flu3 | Parts by Weight | | | | | |
| | Compounds (E) | Photo sensitizer, 2,4,-diethyl thioxanthone (DETX-S, produced by Nippon Kayaku Co., Ltd.) | Parts by Weight | | | | | |
| | | Photo sensitizer, benzophenone (produced by Wako Pure Chemical Industries, Ltd.) | Parts by Weight | | | | | |
| | Other Ingredient | Photo cationic catalyst (SP-170, produced by ADEKA Corp.) | Parts by Weight | | | | | |
| | | DICY (DICY15, produced by Japan Epoxy Resins Co., Ltd.) | Parts by Weight | | | | | |
| | | 3-Aminopropyl trimethoxysilane (KBM-903, produced by Shin-Etsu Chemical Co., Ltd.) | Parts by Weight | | | | | |
| Evaluations | (1) Shear Adhesion | Immediately After the Sticking | kgf/cm$^2$ | 0.1 | 0.2 | 0.5 | 0.7 | 0.8 |
| | | 24 Hours After the Sticking | kKf/cm$^2$ | 1.2 | 1.8 | 3.2 | 4.6 | 4.6 |
| | | 7 Days After the Sticking | kgf/cm$^2$ | 10 | 11 | 13 | 15 | 15 |
| | (2) *1 | 7 Days After the Sticking | *2 | No Dropping | No Dropping | No Dropping | No Dropping | No Dropping |
| | (3) Adhesion Force to Aluminum Plate | | kgf/cm$^2$ | 11 | 10 | 12 | 12 | 13 |
| | (4) Adhesion Force to Cold-Reduced Carbon Steel Plate (SPCC) | | kgf/cm$^2$ | 12 | 14 | 15 | 15 | 14 |
| | (5) Adhesion Force to Copper Plate | | kgf/cm$^2$ | 11 | 11 | 13 | 12 | 16 |
| | (6) Releasability of Release PET Film | | | Δ | ◉ | ◉ | ◉ | ◉ |
| | (7) Cast-Film Formability | | | ○ | ○ | ○ | ○ | ○ |

| | | | | Examples | | | |
|---|---|---|---|---|---|---|---|
| | | | | 11 | 12 | 13 | 14 |
| Ingredients | Compounds (A) | Bisphenol A type epoxy resin (EPIKOTE 834, produced by Japan Epoxy Resins Co., Ltd.) | Parts by Weight | 30 | 30 | 30 | 30 |
| | | Bisphenol A type epoxy resin (EPIKOTE 100, produced by Japan Epoxy Resins Co., Ltd.) | Parts by Weight | | | | |
| | | Tolylene diisocyanate (TDI, produced by Wako Pure Chemical Industries, Ltd. | Parts by Weight | | | | |
| | | Resin 14 (solid), GMA-copolymerized acryl resin | Parts by Weight | | | | |
| | | Resin 15 (solid), MOI-copolymerized acryl resin | Parts by Weight | | | | |
| | | Dipentaerythritol hexaacrylate (LIGHT-ACRYLATE DPE-6A, produced by Kyoeisha Chemical Co., Ltd.) | Parts by Weight | | | | |
| | | Resin 16 (solid), alkoxysilylated acryl resin 1 | Parts by Weight | | | | |
| | | Resin 17 (solid), alkoxysilylated acryl resin 2 | Parts by Weight | | | | |
| | | Resin 18 (solid), maleic anhydride-copolymerized acryl resin | Parts by Weight | | | | |
| | Compounds (B) | PBG-2 | Parts by Weight | 30 | 30 | 30 | 30 |
| | | PBG-KA, ketoprofen type photobase generator | Parts by Weight | | | | |
| | Compounds (C) | Resin 1 (solid), polyethyl acrylate, Mn: 50000 | Parts by Weight | | | | |
| | | Resin 2 (solid), polyacrylamide copolymer, Mn 50000 | Parts by Weight | | | | |
| | | Resin 3 (solid), polyethyl acrylate, Mn: 20000 | Parts by Weight | | | | |
| | | Resin 4 (solid), polyethyl acrylate, Mn: 80000 | Parts by Weight | | | | |
| | | Resin 5 (solid), polyethyl acrylate, Mn: 101000 | Parts by Weight | | | | |

TABLE 2-continued

|  |  |  |  |  |  |  |  |
|---|---|---|---|---|---|---|---|
|  |  | Resin 6 (solid), polyethyl acrylate, Mn: 187000 | Parts by Weight |  |  |  |  |
|  |  | Resin 7 (solid), polyethyl acrylate, Mn: 221000 | Parts by Weight |  |  |  |  |
|  |  | Resin 8 (solid), polyethyl acrylate, Mn: 483000 | Parts by Weight | 40 |  |  |  |
|  |  | Resin 9 (solid), polyethyl acrylate, Mn: 650000 | Parts by Weight |  | 40 |  |  |
|  |  | Resin 10 (solid), polyethyl acrylate, Mn: 840000 | Parts by Weight |  |  | 40 |  |
|  |  | Resin 11 (solid), polyacrylonitrile copolymer, Mn: 120000 | Parts by Weight |  |  |  | 40 |
|  |  | Resin 12 (solid), polyvinyl pyrrolidone copolymer, Mn: 143000 | Parts by Weight |  |  |  |  |
|  |  | Resin 13 (solid), HEMA copolymer, Mn: 143000 | Parts by Weight |  |  |  |  |
|  |  | Polyester (VYLON GK780, produced by Toyobo Co., Ltd.) | Parts by Weight |  |  |  |  |
|  |  | Polyurethane (NIPPOLLAN 5199, produced by Nippon Polyurethane Industry Co., Ltd.) | Parts by Weight |  |  |  |  |
|  | Compound (D) | Flu3 | Parts by Weight |  |  |  |  |
|  | Compounds (E) | Photo sensitizer, 2,4,-diethyl thioxanthone (DETX-S, produced by Nippon Kayaku Co., Ltd.) | Parts by Weight |  |  |  |  |
|  |  | Photo sensitizer, benzophenone (produced by Wako Pure Chemical Industries, Ltd.) | Parts by Weight |  |  |  |  |
|  | Other Ingredient | Photo cationic catalyst (SP-170, produced by ADEKA Corp.) | Parts by Weight |  |  |  |  |
|  |  | DICY (DICY15, produced by Japan Epoxy Resins Co., Ltd.) | Parts by Weight |  |  |  |  |
|  |  | 3-Aminopropyl trimethoxysilane (KBM-903, produced by Shin-Etsu Chemical Co., Ltd.) | Parts by Weight |  |  |  |  |
| Evaluations | (1) Shear Adhesion | Immediately After the Sticking | kgf/cm$^2$ | 0.8 | 0.8 | 1 | 1.1 |
|  |  | 24 Hours After the Sticking | kKf/cm$^2$ | 4.8 | 5.2 | 5.4 | 6.6 |
|  |  | 7 Days After the Sticking | kgf/cm$^2$ | 18 | 18 | 19 | 17 |
|  | (2) *1 | 7 Days After the Sticking | *2 | No Dropping | No Dropping | No Dropping | No Dropping |
|  | (3) Adhesion Force to Aluminum Plate |  | kgf/cm$^2$ | 16 | 14 | 16 | 24 |
|  | (4) Adhesion Force to Cold-Reduced Carbon Steel Plate (SPCC) |  | kgf/cm$^2$ | 19 | 21 | 21 | 21 |
|  | (5) Adhesion Force to Copper Plate |  | kgf/cm$^2$ | 18 | 17 | 20 | 25 |
|  | (6) Releasability of Release PET Film |  |  | ◉ | ◉ | ◉ | ◉ |
|  | (7) Cast-Film Formability |  |  | ○ | ○ | △ | ○ |

|  |  |  |  | Examples ||||
|---|---|---|---|---|---|---|---|
|  |  |  |  | 15 | 16 | 17 | 18 |
| Ingredients | Compounds (A) | Bisphenol A type epoxy resin (EPIKOTE 834, produced by Japan Epoxy Resins Co., Ltd.) | Parts by Weight | 30 | 30 | 30 | 30 |
|  |  | Bisphenol A type epoxy resin (EPIKOTE 100, produced by Japan Epoxy Resins Co., Ltd.) | Parts by Weight |  |  |  |  |
|  |  | Tolylene diisocyanate (TDI, produced by Wako Pure Chemical Industries, Ltd. | Parts by Weight |  |  |  |  |
|  |  | Resin 14 (solid), GMA-copolymerized acryl resin | Parts by Weight |  |  |  |  |
|  |  | Resin 15 (solid), MOI-copolymerized acryl resin | Parts by Weight |  |  |  |  |
|  |  | Dipentaerythritol hexaacrylate (LIGHT-ACRYLATE DPE-6A, produced by Kyoeisha Chemical Co., Ltd.) | Parts by Weight |  |  |  |  |
|  |  | Resin 16 (solid), alkoxysilylated acryl resin 1 | Parts by Weight |  |  |  |  |
|  |  | Resin 17 (solid), alkoxysilylated acryl resin 2 | Parts by Weight |  |  |  |  |
|  |  | Resin 18 (solid), maleic anhydride-copolymerized acryl resin | Parts by Weight |  |  |  |  |
|  | Compounds (B) | PBG-2 | Parts by Weight | 30 | 30 | 30 | 30 |
|  |  | PBG-KA, ketoprofen type photobase generator | Parts by Weight |  |  |  |  |
|  | Compounds (C) | Resin 1 (solid), polyethyl acrylate, Mn: 50000 | Parts by Weight |  |  |  |  |
|  |  | Resin 2 (solid), polyacrylamide copolymer, Mn 50000 | Parts by Weight |  |  |  |  |
|  |  | Resin 3 (solid), polyethyl acrylate, Mn: 20000 | Parts by Weight |  |  |  |  |
|  |  | Resin 4 (solid), polyethyl acrylate, Mn: 80000 | Parts by Weight |  |  |  |  |

TABLE 2-continued

|  |  |  |  |  |  |  |  |
|---|---|---|---|---|---|---|---|
|  |  | Resin 5 (solid), polyethyl acrylate, Mn: 101000 | Parts by Weight |  |  |  |  |
|  |  | Resin 6 (solid), polyethyl acrylate, Mn: 187000 | Parts by Weight |  |  |  |  |
|  |  | Resin 7 (solid), polyethyl acrylate, Mn: 221000 | Parts by Weight |  |  |  |  |
|  |  | Resin 8 (solid), polyethyl acrylate, Mn: 483000 | Parts by Weight |  |  |  |  |
|  |  | Resin 9 (solid), polyethyl acrylate, Mn: 650000 | Parts by Weight |  |  |  |  |
|  |  | Resin 10 (solid), polyethyl acrylate, Mn: 840000 | Parts by Weight |  |  |  |  |
|  |  | Resin 11 (solid), polyacrylonitrile copolymer, Mn: 120000 | Parts by Weight |  |  |  |  |
|  |  | Resin 12 (solid), polyvinyl pyrrolidone copolymer, Mn: 143000 | Parts by Weight | 40 |  |  |  |
|  |  | Resin 13 (solid), HEMA copolymer, Mn: 143000 | Parts by Weight |  | 40 |  |  |
|  |  | Polyester (VYLON GK780, produced by Toyobo Co., Ltd.) | Parts by Weight |  |  | 40 |  |
|  |  | Polyurethane (NIPPOLLAN 5199, produced by Nippon Polyurethane Industry Co., Ltd.) | Parts by Weight |  |  |  | 40 |
|  | Compound (D) | Flu3 | Parts by Weight |  |  |  |  |
|  | Compounds (E) | Photo sensitizer, 2,4,-diethyl thioxanthone (DETX-S, produced by Nippon Kayaku Co., Ltd.) | Parts by Weight |  |  |  |  |
|  |  | Photo sensitizer, benzophenone (produced by Wako Pure Chemical Industries, Ltd.) | Parts by Weight |  |  |  |  |
|  | Other Ingredient | Photo cationic catalyst (SP-170, produced by ADEKA Corp.) | Parts by Weight |  |  |  |  |
|  |  | DICY (DICY15, produced by Japan Epoxy Resins Co., Ltd.) | Parts by Weight |  |  |  |  |
|  |  | 3-Aminopropyl trimethoxysilane (KBM-903, produced by Shin-Etsu Chemical Co., Ltd.) | Parts by Weight |  |  |  |  |
| Evalua-tions | (1) Shear Adhesion | Immediately After the Sticking | kgf/cm$^2$ | 0.9 | 0.8 | 0.7 | 0.6 |
|  |  | 24 Hours After the Sticking | kKf/cm$^2$ | 4.3 | 4.2 | 3.1 | 2.9 |
|  |  | 7 Days After the Sticking | kgf/cm$^2$ | 16 | 16 | 18 | 21 |
|  | (2) *1 | 7 Days After the Sticking | *2 | No Dropping | No Dropping | No Dropping | No Dropping |
|  | (3) Adhesion Force to Aluminum Plate |  | kgf/cm$^2$ | 23 | 21 | 20 | 25 |
|  | (4) Adhesion Force to Cold-Reduced Carbon Steel Plate (SPCC) |  | kgf/cm$^2$ | 22 | 21 | 29 | 26 |
|  | (5) Adhesion Force to Copper Plate |  | kgf/cm$^2$ | 26 | 23 | 22 | 23 |
|  | (6) Releasability of Release PET Film |  |  | ◎ | ◎ | ◎ | ◎ |
|  | (7) Cast-Film Formability |  |  | ○ | ○ | ○ | ○ |

*1: Thermal Creep Resistance
*2: Elapsed Time for Dropping

TABLE 3

|  |  |  |  | Examples | | | | | | |
|---|---|---|---|---|---|---|---|---|---|---|
|  |  |  |  | 19 | 20 | 21 | 22 | 23 | 24 | 25 |
| Ingre-dients | Compounds (A) | Bisphenol A type epoxy resin (EPIKOTE 834, produced by Japan Epoxy Resins Co., Ltd.) | Parts by Weight | 30 | 30 | 30 | 30 | 47 | 10 | 10 |
|  |  | Bisphenol A type epoxy resin (EPIKOTE 100, produced by Japan Epoxy Resins Co., Ltd.) | Parts by Weight |  |  |  |  |  |  |  |
|  |  | Tolylene diisocyanate (TDI, produced by Wako Pure Chemical Industries, Ltd.) | Parts by Weight |  |  |  |  |  |  |  |
|  |  | Resin 14 (solid), GMA-copolymerized acryl resin | Parts by Weight |  |  |  |  |  |  |  |
|  |  | Resin 15 (solid), MOI-copolymerized acryl resin | Parts by Weight |  |  |  |  |  |  |  |
|  |  | Dipentaerythritol hexaacrylate (LIGHT-ACRYLATE DPE-6A, produced by Kyoeisha Chemical Co., Ltd.) | Parts by Weight |  |  |  |  |  |  |  |
|  |  | Resin 16 (solid), alkoxysilylated acryl resin 1 | Parts by Weight |  |  |  |  |  |  |  |
|  |  | Resin 17 (solid), alkoxysilylated acryl resin 2 | Parts by Weight |  |  |  |  |  |  |  |
|  |  | Resin 18 (solid), maleic anhydride-copolymerized acryl resin | Parts by Weight |  |  |  |  |  |  |  |

TABLE 3-continued

| | | | | | | | | | | |
|---|---|---|---|---|---|---|---|---|---|---|
| | Compounds (B) | PBG-2 | Parts by Weight | 2 | 5 | 50 | 70 | 47 | 50 | 20 |
| | | PBG-KA, ketoprofen type photobase generator | Parts by Weight | | | | | | | |
| | Compounds (C) | Resin 1 (solid), polyethyl acrylate, Mn: 50000 | Parts by Weight | | | | | 8 | 40 | 70 |
| | | Resin 2 (solid), polyacrylamide copolymer, Mn 50000 | Parts by Weight | 68 | 65 | 10 | 10 | | | |
| | | Resin 3 (solid), polyethyl acrylate, Mn: 20000 | Parts by Weight | | | | | | | |
| | | Resin 4 (solid), polyethyl acrylate, Mn: 80000 | Parts by Weight | | | | | | | |
| | | Resin 5 (solid), polyethyl acrylate, Mn: 101000 | Parts by Weight | | | | | | | |
| | | Resin 6 (solid), polyethyl acrylate, Mn: 187000 | Parts by Weight | | | | | | | |
| | | Resin 7 (solid), polyethyl acrylate, Mn: 221000 | Parts by Weight | | | | | | | |
| | | Resin 8 (solid), polyethyl acrylate, Mn: 483000 | Parts by Weight | | | | | | | |
| | | Resin 9 (solid), polyethyl acrylate, Mn: 650000 | Parts by Weight | | | | | | | |
| | | Resin 10 (solid), polyethyl acrylate, Mn: 840000 | Parts by Weight | | | | | | | |
| | | Resin 11 (solid), polyacrylonitrile copolymer, Mn: 120000 | Parts by Weight | | | | | | | |
| | | Resin 12 (solid), polyvinyl pyrrolidone copolymer, Mn: 143000 | Parts by Weight | | | | | | | |
| | | Resin 13 (solid), HEMA copolymer, Mn: 143000 | Parts by Weight | | | | | | | |
| | | Polyester (VYLON GK780, produced by Toyobo Co., Ltd.) | Parts by Weight | | | | | | | |
| | | Polyurethane (NIPPOLLAN 5199 produced by Nippon Polyurethane Industry Co, Ltd.) | Parts by Weight | | | | | | | |
| | Compound (D) | Flu3 | Parts by Weight | | | | | | | |
| | Compounds (E) | Photo sensitizer, 2,4-diethyl thioxanthone (DETX-S, produced by Nippon Kayaku Co., Ltd.) | Parts by Weight | | | | | | | |
| | | Photo sensitizer, benzophenone (produced by Wako Pure Chemical Industries, Ltd.) | Parts by Weight | | | | | | | |
| | Other Ingredient | Photo cationic catalyst (SP-170, produced by ADEKA Corp.) | Parts by Weight | | | | | | | |
| | | DICY (DICY15, produced by Japan Epoxy Resins Co., Ltd.) | Parts by Weight | | | | | | | |
| | | 3-Aminopropyl trimethoxysilane (KBM-903, produced by Shin-Etsu Chemical Co., Ltd.) | Parts by Weight | | | | | | | |
| Evaluations | (1) Shear Adhesion | Immediately After the Sticking | kgf/cm$^2$ | 0.3 | 0.4 | 0.2 | 0.2 | <0.1 | 0.4 | 0.8 |
| | | 24 Hours After the Sticking | kgf/cm$^2$ | 1.6 | 2.1 | 4.6 | 3.4 | 0.8 | 2.6 | 1.5 |
| | | 7 Days After the Sticking | kgf/cm$^2$ | 2.3 | 14 | 18 | 3.8 | 36 | 16 | 4.8 |
| | (2) *1 | 7 Days After the Sticking | *2 | 3 hours | No Dropping | No Dropping | 12 hours | No Dropping | No Dropping | 12 hours |
| | (3) Adhesion Force to Aluminum Plate | | kgf/cm$^2$ | 1.8 | 16 | 19 | 3.6 | 26 | 20 | 5.3 |
| | (4) Adhesion Force to Cold-Reduced Carbon Steel Plate (SPCC) | | kgf/cm$^2$ | 3.6 | 16 | 21 | 4.1 | 32 | 18 | 6.7 |
| | (5) Adhesion Force to Copper Plate | | kgf/cm$^2$ | 2.1 | 19 | 18 | 3.2 | 29 | 21 | 4.9 |
| | (6) Reusability of Release PET Film | | | ◎ | ◎ | ◎ | ◎ | ◎ | ◎ | ◎ |
| | (7) Cast-Film Formability | | | ○ | ○ | ○ | ○ | ○ | ○ | ○ |

| | | | | Examples | | | Comp. Examples | | |
|---|---|---|---|---|---|---|---|---|---|
| | | | | 26 | 27 | 28 | 2 | 3 | 4 |
| Ingredients | Compounds (A) | Bisphenol A type epoxy resin (EPIKOTE 834, produced by Japan Epoxy Resins Co., Ltd.) | Parts by Weight | 30 | 30 | 30 | 30 | 45 | 30 |
| | | Bisphenol A type epoxy resin (EPIKOTE 100, produced by Japan Epoxy Resins Co., Ltd.) | Parts by Weight | | | | | | |
| | | Tolylene diisocyanate (TDI, produced by Wako Pure Chemical Industries, Ltd.) | Parts by Weight | | | | | | |
| | | Resin 14 (solid), GMA-copolymerized acryl resin | Parts by Weight | | | | | | |
| | | Resin 15 (solid), MOI-copolymerized acryl resin | Parts by Weight | | | | | | |
| | | Dipentaerythritol hexaacrylate (LIGHT-ACRYLATE DPE-6A, produced by Kyoeisha Chemical Co., Ltd.) | Parts by Weight | | | | | | |
| | | Resin 16 (solid), alkoxysilylated acryl resin 1 | Parts by Weight | | | | | | |
| | | Resin 17 (solid), alkoxysilylated acryl resin 2 | Parts by Weight | | | | | | |

TABLE 3-continued

| | | | | | | | | | |
|---|---|---|---|---|---|---|---|---|---|
| | | Resin 18 (solid), maleic anhydride-copolymerized acryl resin | Parts by Weight | | | | | | |
| | Compounds (B) | PBG-2 | Parts by Weight | 30 | 30 | 30 | | | |
| | | PBG-KA, ketoprofen type photobase generator | Parts by Weight | | | | | | |
| | Compounds (C) | Resin 1 (solid), polyethyl acrylate, Mn: 50000 | Parts by Weight | 40 | | | | | |
| | | Resin 2 (solid), polyacrylamide copolymer, Mn 50000 | Parts by Weight | | | | 70 | 50 | |
| | | Resin 3 (solid), polyethyl acrylate, Mn: 20000 | Parts by Weight | | | | | | 60 |
| | | Resin 4 (solid), polyethyl acrylate, Mn: 80000 | Parts by Weight | | | | | | |
| | | Resin 5 (solid), polyethyl acrylate, Mn: 101000 | Parts by Weight | | 40 | 40 | | | |
| | | Resin 6 (solid), polyethyl acrylate, Mn: 187000 | Parts by Weight | | | | | | |
| | | Resin 7 (solid), polyethyl acrylate, Mn: 221000 | Parts by Weight | | | | | | |
| | | Resin 8 (solid), polyethyl acrylate, Mn: 483000 | Parts by Weight | | | | | | |
| | | Resin 9 (solid), polyethyl acrylate, Mn: 650000 | Parts by Weight | | | | | | |
| | | Resin 10 (solid), polyethyl acrylate, Mn: 840000 | Parts by Weight | | | | | | |
| | | Resin 11 (solid), polyacrylonitrile copolymer, Mn: 120000 | Parts by Weight | | | | | | |
| | | Resin 12 (solid), polyvinyl pyrrolidone copolymer, Mn: 143000 | Parts by Weight | | | | | | |
| | | Resin 13 (solid), HEMA copolymer, Mn: 143000 | Parts by Weight | | | | | | |
| | | Polyester (VYLON GK780, produced by Toyobo Co., Ltd.) | Parts by Weight | | | | | | |
| | | Polyurethane (NIPPOLLAN 5199 produced by Nippon Polyurethane Industry Co, Ltd.) | Parts by Weight | | | | | | |
| | Compound (D) | Flu3 | Parts by Weight | | | | | | |
| | Compounds (E) | Photo sensitizer, 2,4-diethyl thioxanthone (DETX-S, produced by Nippon Kayaku Co., Ltd.) | Parts by Weight | | 2 | | | | |
| | | Photo sensitizer, benzophenone (produced by Wako Pure Chemical Industries, Ltd.) | Parts by Weight | | | 2 | | | |
| | Other Ingredient | Photo cationic catalyst (SP-170, produced by ADEKA Corp.) | Parts by Weight | | | | 1 | | 1 |
| | | DICY (DICY15, produced by Japan Epoxy Resins Co., Ltd.) | Parts by Weight | | | | | 5 | |
| | | 3-Aminopropyl trimethoxysilane (KBM-903, produced by Shin-Etsu Chemical Co., Ltd.) | Parts by Weight | 2 | | | | | 2 |
| Evaluations | (1) Shear Adhesion | Immediately After the Sticking | kgf/cm$^2$ | 0.1 | 0.6 | 0.5 | 0.8 | 0.6 | 0.2 |
| | | 24 Hours After the Sticking | kgf/cm$^2$ | 1.3 | 5.4 | 6.1 | 0.8 | 0.6 | 0.3 |
| | | 7 Days After the Sticking | kgf/cm$^2$ | 15 | 14 | 12 | 0.8 | 0.6 | 0.2 |
| | (2) *1 | 7 Days After the Sticking | *2 | No Dropping | No Dropping | No Dropping | 10 min. | 10 min. | 1 min. |
| | (3) Adhesion Force to Aluminum Plate | | kgf/cm$^2$ | 16 | 13 | 19 | 0.5 | 0.4 | 0.6 |
| | (4) Adhesion Force to Cold-Reduced Carbon Steel Plate (SPCC) | | kgf/cm$^2$ | 19 | 16 | 19 | 0.8 | 0.6 | 0.7 |
| | (5) Adhesion Force to Copper Plate | | kgf/cm$^2$ | 15 | 18 | 21 | 0.6 | 0.6 | 0.8 |
| | (6) Reusability of Release PET Film | | | ◎ | ◎ | ◎ | ◎ | ◎ | ◎ |
| | (7) Cast-Film Formability | | | ○ | ○ | ○ | ○ | ○ | ○ |

*1: Thermal Creep Resistance
*2: Elapsed Time for Dropping

TABLE 4

| | | | | Examples | | | |
|---|---|---|---|---|---|---|---|
| | | | | 29 | 30 | 31 | 32 |
| Ingredients | Compounds (A) | Bisphenol A type epoxy resin (EPIKOTE 834, produced by Japan Epoxy Resins Co., Ltd.) | Parts by Weight | | | | |
| | | Bisphenol A type epoxy resin (EPIKOTE 100, produced by Japan Epoxy Resins Co., Ltd.) | Parts by Weight | | | | |
| | | Tolylene diisocyanate (TDI, produced by Wako Pure Chemical Industries, Ltd.) | Parts by Weight | | | | |
| | | Resin 14 (solid), GMA-copolymerized acryl resin | Parts by Weight | 30 | | | |

TABLE 4-continued

| | | | | | | | |
|---|---|---|---|---|---|---|---|
| | | Resin 15 (solid), MOI-copolymerized acryl resin | Parts by Weight | | 30 | | |
| | | Dipentaerythritol hexaacrylate (LIGHT-ACRYLATE DPE-6A, produced by Kyoeisha Chemical Co., Ltd.) | Parts by Weight | | | 30 | |
| | | Resin 16 (solid), alkoxysilylated acryl resin 1 | Parts by Weight | | | | 30 |
| | | Resin 17 (solid), alkoxysilylated acryl resin 2 | Parts by Weight | | | | |
| | | Resin 18 (solid), maleic anhydride-copolymerized acryl resin | Parts by Weight | | | | |
| | Compounds (B) | PBG-22 | Parts by Weight | 15 | 15 | 15 | 15 |
| | | PBG-KA, ketoprofen type photobase generator | Parts by Weight | | | | |
| | Compounds (C) | Resin 1 (solid), polyethyl acrylate, Mn: 50000 | Parts by Weight | | | | |
| | | Resin 2 (solid), polyacrylamide copolymer, Mn 50000 | Parts by Weight | | | | |
| | | Resin 3 (solid), polyethyl acrylate, Mn: 20000 | Parts by Weight | | | | |
| | | Resin 4 (solid), polyethyl acrylate, Mn: 80000 | Parts by Weight | | | | |
| | | Resin 5 (solid), polyethyl acrylate, Mn: 101000 | Parts by Weight | 55 | 55 | 55 | 55 |
| | | Resin 6 (solid), polyethyl acrylate, Mn: 187000 | Parts by Weight | | | | |
| | | Resin 7 (solid), polyethyl acrylate, Mn: 221000 | Parts by Weight | | | | |
| | | Resin 8 (solid), polyethyl acrylate, Mn: 483000 | Parts by Weight | | | | |
| | | Resin 9 (solid), polyethyl acrylate, Mn: 650000 | Parts by Weight | | | | |
| | | Resin 10 (solid), polyethyl acrylate, Mn: 840000 | Parts by Weight | | | | |
| | | Resin 11 (solid), polyacrylonitrile copolymer, Mn: 120000 | Parts by Weight | | | | |
| | | Resin 12 (solid), polyvinyl pyrrolidone copolymer, Mn: 143000 | Parts by Weight | | | | |
| | | Resin 13 (solid), HEMA copolymer, Mn: 143000 | Parts by Weight | | | | |
| | | Polyester (VYLON GK780, produced by Toyobo Co., Ltd.) | Parts by Weight | | | | |
| | | Polyurethane (NIPPOLLAN 5199, produced by Nippon Polyurethane Industry Co., Ltd.) | Parts by Weight | | | | |
| | Compound (D) | Flu3 | Parts by Weight | | | | |
| | Compounds (E) | Photo sensitizer, 2,4-diethyl thioxanthone (DETX-S, produced by Nippon Kayaku Co., Ltd.) | Parts by Weight | | | | |
| | | Photo sensitizer, benzophenone (produced by Wako Pure Chemical Industries, Ltd.) | Parts by Weight | | | | |
| | Other Ingredient | Photo cationic catalyst (SP-170, produced by ADEKA Corp.) | Parts by Weight | | | | |
| | | DICY (DICY15, produced by Japan Epoxy Resins Co., Ltd.) | Parts by Weight | | | | |
| | | 3-Aminopropyl trimethoxysilane(KBM-903, produced by Shin-Etsu Chemical Co., Ltd.) | Parts by Weight | | | | |
| Evaluations | (1) Shear Adhesion | Immediately After the Sticking | kgf/cm$^2$ | 0.5 | 0.5 | 0.2 | 0.5 |
| | | 24 Hours After the Sticking | kgf/cm$^2$ | 2.1 | 2.5 | 3.4 | 3.1 |
| | | 7 Days After the Sticking | kgf/cm$^2$ | 13 | 15 | 11 | 12 |
| | (2) *1 | 7 Days After the Sticking | *2 | No Dropping | No Dropping | No Dropping | No Dropping |
| | (3) Adhesion Force to Aluminum Plate | | kgf/cm$^2$ | 10 | 16 | 12 | 9.4 |
| | (4) Adhesion Force to Cold-Reduced Carbon Steel Plate (SPCC) | | kgf/cm$^2$ | 12 | 17 | 16 | 13 |
| | (5) Adhesion Force to Copper Plate | | kgf/cm$^2$ | 12 | 19 | 13 | 10 |
| | (6) Releasability of Release PET Film | | | ◎ | ◎ | ○ | ◎ |
| | (7) Cast-Film Formability | | | ○ | ○ | ○ | ○ |

| | | | | Examples | | |
|---|---|---|---|---|---|---|
| | | | | 33 | 34 | 35 |
| Ingredients | Compounds (A) | Bisphenol A type epoxy resin (EPIKOTE 834, produced by Japan Epoxy Resins Co., Ltd.) | Parts by Weight | | | 30 |
| | | Bisphenol A type epoxy resin (EPIKOTE 100, produced by Japan Epoxy Resins Co., Ltd.) | Parts by Weight | | | |
| | | Tolylene diisocyanate (TDI, produced by Wako Pure Chemical Industries, Ltd.) | Parts by Weight | | | |

TABLE 4-continued

| | | | | | | |
|---|---|---|---|---|---|---|
| | | Resin 14 (solid), GMA-copolymerized acryl resin | Parts by Weight | | | |
| | | Resin 15 (solid), MOI-copolymerized acryl resin | Parts by Weight | | | |
| | | Dipentaerythritol hexaacrylate (LIGHT-ACRYLATE DPE-6A, produced by Kyoeisha Chemical Co., Ltd.) | Parts by Weight | | | |
| | | Resin 16 (solid), alkoxysilylated acryl resin 1 | Parts by Weight | | | |
| | | Resin 17 (solid), alkoxysilylated acryl resin 2 | Parts by Weight | 30 | | |
| | | Resin 18 (solid), maleic anhydride-copolymerized acryl resin | Parts by Weight | | 30 | |
| | Compounds (B) | PBG-22 | Parts by Weight | 15 | 15 | |
| | | PBG-KA, ketoprofen type photobase generator | Parts by Weight | | | 30 |
| | Compounds (C) | Resin 1 (solid), polyethyl acrylate, Mn: 50000 | Parts by Weight | | | |
| | | Resin 2 (solid), polyacrylamide copolymer, Mn 50000 | Parts by Weight | | | 40 |
| | | Resin 3 (solid), polyethyl acrylate, Mn: 20000 | Parts by Weight | | | |
| | | Resin 4 (solid), polyethyl acrylate, Mn: 80000 | Parts by Weight | | | |
| | | Resin 5 (solid), polyethyl acrylate, Mn: 101000 | Parts by Weight | 55 | 55 | |
| | | Resin 6 (solid), polyethyl acrylate, Mn: 187000 | Parts by Weight | | | |
| | | Resin 7 (solid), polyethyl acrylate, Mn: 221000 | Parts by Weight | | | |
| | | Resin 8 (solid), polyethyl acrylate, Mn: 483000 | Parts by Weight | | | |
| | | Resin 9 (solid), polyethyl acrylate, Mn: 650000 | Parts by Weight | | | |
| | | Resin 10 (solid), polyethyl acrylate, Mn: 840000 | Parts by Weight | | | |
| | | Resin 11 (solid), polyacrylonitrile copolymer, Mn: 120000 | Parts by Weight | | | |
| | | Resin 12 (solid), polyvinyl pyrrolidone copolymer, Mn: 143000 | Parts by Weight | | | |
| | | Resin 13 (solid), HEMA copolymer, Mn: 143000 | Parts by Weight | | | |
| | | Polyester (VYLON GK780, produced by Toyobo Co., Ltd.) | Parts by Weight | | | |
| | | Polyurethane (NIPPOLLAN 5199, produced by Nippon Polyurethane Industry Co., Ltd.) | Parts by Weight | | | |
| | Compound (D) | Flu3 | Parts by Weight | | | |
| | Compounds (E) | Photo sensitizer, 2,4-diethyl thioxanthone (DETX-S, produced by Nippon Kayaku Co., Ltd.) | Parts by Weight | | | |
| | | Photo sensitizer, benzophenone (produced by Wako Pure Chemical Industries, Ltd.) | Parts by Weight | | | |
| | Other Ingredient | Photo cationic catalyst (SP-170, produced by ADEKA Corp.) | Parts by Weight | | | |
| | | DICY (DICY15, produced by Japan Epoxy Resins Co., Ltd.) | Parts by Weight | | | |
| | | 3-Aminopropyl trimethoxysilane(KBM-903, produced by Shin-Etsu Chemical Co., Ltd.) | Parts by Weight | | | |
| Evaluations | (1) Shear Adhesion | Immediately After the Sticking | kgf/cm$^2$ | 0.4 | 0.4 | 0.4 |
| | | 24 Hours After the Sticking | kgf/cm$^2$ | 2.6 | 4.1 | 2.6 |
| | | 7 Days After the Sticking | kgf/cm$^2$ | 10 | 16 | 12 |
| | (2) *1 | 7 Days After the Sticking | *2 | No Dropping | No Dropping | No Dropping |
| | (3) Adhesion Force to Aluminum Plate | | kgf/cm$^2$ | 12 | 21 | 15 |
| | (4) Adhesion Force to Cold-Reduced Carbon Steel Plate (SPCC) | | kgf/cm$^2$ | 13 | 18 | 16 |
| | (5) Adhesion Force to Copper Plate | | kgf/cm$^2$ | 12 | 23 | 19 |
| | (6) Releasability of Release PET Film | | | ◉ | ◉ | ◉ |
| | (7) Cast-Film Formability | | | ○ | ○ | ○ |

*1: Thermal Creep Resistance
*2: Elapsed Time for Dropping

The invention claimed is:

1. A photocurable pressure-sensitive adhesive composition,
which comprises a crosslinking compound (A) that is crosslinkable by the action of a base, a photobase generator (B) that generates a base by irradiation with light, and a tackifying component (C),
wherein the crosslinking compound (A) that is crosslinkable by the action of a base is an epoxy compound having two or more epoxy groups in one molecule thereof or isocyanate oligomer having two or more isocyanato groups in one molecule thereof, and
wherein the tackifying component (C) is a polymer, the polymer is a resin that exhibits adhesion, and the number-average molecular weight of the polymer is 50,000 to 5,000,000.

2. The photocurable pressure-sensitive adhesive composition according to claim 1,
wherein the tackifying component (C) has a polar functional group.

3. The photocurable pressure-sensitive adhesive composition according to claim 1,
which further comprises a base proliferating agent (D).

4. The photocurable pressure-sensitive adhesive composition according to claim 3,
wherein the base proliferating agent (D) is a base proliferating agent (D1) that has a base proliferating group represented by the following formula (1)

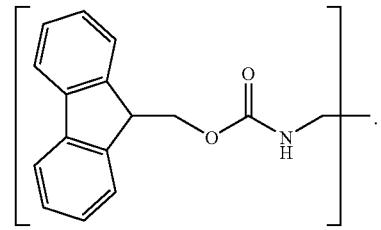

(1)

5. The photocurable pressure-sensitive adhesive composition according to claim 3,
which further comprises a photo-sensitizer (E).

6. The photocurable pressure-sensitive adhesive composition according to claim 1,
which further comprises a photo-sensitizer (E).

7. The photocurable pressure-sensitive adhesive composition according to claim 1,
wherein the photobase generator (B) is an ortho-nitrobenzyl photobase generator or a ketoprofen photobase generator.

8. The photocurable pressure-sensitive adhesive composition according to claim 1,
wherein the tackifying component (C) is at least one polymer selected from the group consisting of (meth)acrylic polymer, polyester, polyurethane, polyolefin, and silicone polymer.

* * * * *